United States Patent
Jia et al.

(10) Patent No.: US 7,390,744 B2
(45) Date of Patent: Jun. 24, 2008

(54) METHOD AND COMPOSITION FOR POLISHING A SUBSTRATE

(75) Inventors: Renhe Jia, Berkeley, CA (US); Feng Q. Liu, San Jose, CA (US); Stan D. Tsai, Fremont, CA (US); Liang-Yuh Chen, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 292 days.

(21) Appl. No.: 11/130,032

(22) Filed: May 16, 2005

(65) Prior Publication Data

US 2005/0233578 A1    Oct. 20, 2005

Related U.S. Application Data

(63) Continuation-in-part of application No. 10/948,958, filed on Sep. 24, 2004.

(60) Provisional application No. 60/572,183, filed on May 17, 2004, provisional application No. 60/648,128, filed on Jan. 28, 2005, provisional application No. 60/540,265, filed on Jan. 29, 2004.

(51) Int. Cl.
*H01L 21/302* (2006.01)

(52) U.S. Cl. ............... 438/689; 438/627; 438/692; 438/693; 438/738; 438/792; 257/E21.304

(58) Field of Classification Search ............ 438/738, 438/792
See application file for complete search history.

(56) References Cited

U.S. PATENT DOCUMENTS

| | | | |
|---|---|---|---|
| 2,582,020 A | 1/1952 | Emery | |
| 3,162,588 A | 12/1964 | Bell | |
| 3,239,441 A | 3/1966 | Marosi | |
| 3,448,023 A | 6/1969 | Bell | |
| 3,873,512 A | 3/1975 | Latanision | |
| 4,119,515 A | 10/1978 | Costakis | |
| 4,125,444 A | 11/1978 | Inoue | |

(Continued)

FOREIGN PATENT DOCUMENTS

EP     0 323 748     7/1989

(Continued)

OTHER PUBLICATIONS

D. Landolt, "Fundamental Aspects of Electropolishing", Mar. 18, 1996, pp. 1-11.

(Continued)

*Primary Examiner*—Michael S. Lebentritt
*Assistant Examiner*—Kyoung Lee
(74) *Attorney, Agent, or Firm*—Patterson & Sheridan

(57) ABSTRACT

Polishing compositions and methods for removing conductive materials and barrier materials from a substrate surface are provided. Polishing compositions are provided for removing at least a barrier material from a substrate surface by a chemical mechanical polishing process or by an electrochemical mechanical polishing process. The polishing compositions used in barrier removal may further be used after a process for electrochemical mechanical planarization process of a conductive material. The polishing compositions and methods described herein improve the effective removal rate of materials from the substrate surface with a reduction in planarization type defects.

14 Claims, 8 Drawing Sheets

U.S. PATENT DOCUMENTS

| | | |
|---|---|---|
| 4,263,113 A | 4/1981 | Bernard |
| 4,663,005 A | 5/1987 | Edson |
| 4,666,683 A | 5/1987 | Brown et al. |
| 4,713,149 A | 12/1987 | Hoshino |
| 4,793,895 A | 12/1988 | Kaanta et al. |
| 4,839,993 A | 6/1989 | Masuko et al. |
| 4,934,102 A | 6/1990 | Edson |
| 4,954,141 A | 9/1990 | Takiyama et al. |
| 4,956,056 A | 9/1990 | Zubatova et al. |
| 4,992,135 A | 2/1991 | Doan |
| 5,002,645 A | 3/1991 | Eastland et al. |
| 5,096,550 A | 3/1992 | Mayer et al. |
| 5,114,548 A | 5/1992 | Rhoades |
| 5,129,981 A | 7/1992 | Wang et al. |
| 5,136,817 A | 8/1992 | Tabata et al. |
| 5,209,816 A | 5/1993 | Yu et al. |
| 5,217,586 A | 6/1993 | Datta et al. |
| 5,225,034 A | 7/1993 | Yu et al. |
| 5,256,565 A | 10/1993 | Bernhardt et al. |
| 5,340,370 A | 8/1994 | Cadien et al. |
| 5,391,258 A | 2/1995 | Branacaleoni et al. |
| 5,407,526 A | 4/1995 | Danielson et al. |
| 5,534,106 A | 7/1996 | Cote et al. |
| 5,543,032 A | 8/1996 | Datta et al. |
| 5,567,300 A | 10/1996 | Datta et al. |
| 5,575,706 A | 11/1996 | Tsai et al. |
| 5,578,362 A | 11/1996 | Reinhardt et al. |
| 5,624,300 A | 4/1997 | Kishii et al. |
| 5,637,031 A | 6/1997 | Chen |
| 5,676,587 A | 10/1997 | Landers et al. |
| 5,693,563 A | 12/1997 | Teong |
| 5,735,963 A | 4/1998 | Obeng |
| 5,738,574 A | 4/1998 | Tolles et al. |
| 5,770,095 A | 6/1998 | Sasaki et al. |
| 5,783,489 A | 7/1998 | Kaufman et al. |
| 5,804,507 A | 9/1998 | Perlov et al. |
| 5,807,165 A | 9/1998 | Uzoh et al. |
| 5,842,910 A | 12/1998 | Krywanczyk et al. |
| 5,846,882 A | 12/1998 | Birang |
| 5,866,031 A | 2/1999 | Carprio et al. |
| 5,871,392 A | 2/1999 | Meikle et al. |
| 5,880,003 A | 3/1999 | Hayashi |
| 5,893,796 A | 4/1999 | Birang et al. |
| 5,897,375 A | 4/1999 | Watts et al. |
| 5,897,426 A | 4/1999 | Somekh |
| 5,911,619 A | 6/1999 | Uzoh et al. |
| 5,931,719 A | 8/1999 | Nagahara et al. |
| 5,938,801 A | 8/1999 | Robinson |
| 5,954,997 A | 9/1999 | Kaufman et al. |
| 5,966,151 A | 10/1999 | Wakahara |
| 5,981,454 A | 11/1999 | Small |
| 5,985,748 A | 11/1999 | Watts et al. |
| 6,001,008 A | 12/1999 | Fujimori et al. |
| 6,001,730 A * | 12/1999 | Farkas et al. ............ 438/627 |
| 6,004,880 A | 12/1999 | Liu et al. |
| 6,010,395 A | 1/2000 | Nakajima |
| 6,017,265 A | 1/2000 | Cook et al. |
| 6,020,264 A | 2/2000 | Lustig et al. |
| 6,024,630 A | 2/2000 | Shendon et al. |
| 6,056,851 A | 5/2000 | Hsieh et al. |
| 6,056,864 A | 5/2000 | Cheung |
| 6,063,306 A | 5/2000 | Kaufman et al. |
| 6,066,030 A | 5/2000 | Uzoh |
| 6,068,818 A | 5/2000 | Ackley et al. |
| 6,068,879 A | 5/2000 | Pasch |
| 6,074,949 A | 6/2000 | Schonauer et al. |
| 6,077,412 A | 6/2000 | Ting et al. |
| 6,083,840 A | 7/2000 | Mravic et al. |
| 6,090,239 A | 7/2000 | Liu et al. |
| 6,096,652 A | 8/2000 | Watts et al. |
| 6,099,604 A | 8/2000 | Sandhu et al. |
| 6,103,096 A | 8/2000 | Datta |
| 6,106,728 A | 8/2000 | Iida et al. |
| 6,113,465 A | 9/2000 | Kim et al. |
| 6,116,998 A | 9/2000 | Damgaard et al. |
| 6,117,775 A | 9/2000 | Kondo et al. |
| 6,117,783 A | 9/2000 | Small et al. |
| 6,117,853 A | 9/2000 | Sakai et al. |
| 6,126,853 A | 10/2000 | Kaufman et al. |
| 6,136,714 A | 10/2000 | Schutz |
| 6,141,027 A | 10/2000 | Akutsu et al. |
| 6,143,155 A | 11/2000 | Adams et al. |
| 6,143,656 A | 11/2000 | Yang et al. |
| 6,153,043 A | 11/2000 | Edelstein et al. |
| 6,156,124 A | 12/2000 | Tobin |
| 6,156,661 A | 12/2000 | Small |
| 6,159,079 A | 12/2000 | Zuniga et al. |
| 6,165,052 A | 12/2000 | Yu et al. |
| 6,171,352 B1 | 1/2001 | Lee et al. |
| 6,171,467 B1 | 1/2001 | Weihs et al. |
| 6,176,992 B1 | 1/2001 | Talieh |
| 6,177,026 B1 | 1/2001 | Wang et al. |
| 6,183,686 B1 | 2/2001 | Bardus et al. |
| 6,184,141 B1 | 2/2001 | Avanzino et al. |
| 6,190,237 B1 | 2/2001 | Huyng et al. |
| 6,194,317 B1 | 2/2001 | Kaisaki et al. |
| 6,204,169 B1 * | 3/2001 | Bajaj et al. ................. 438/645 |
| 6,206,756 B1 | 3/2001 | Chopra et al. |
| 6,210,257 B1 | 4/2001 | Carlson |
| 6,217,416 B1 | 4/2001 | Kaufman et al. |
| 6,218,290 B1 | 4/2001 | Schonauer et al. |
| 6,218,305 B1 | 4/2001 | Hosali et al. |
| 6,234,870 B1 | 5/2001 | Uzoh et al. |
| 6,235,633 B1 | 5/2001 | Jang |
| 6,238,271 B1 | 5/2001 | Cesna |
| 6,238,592 B1 | 5/2001 | Hardy et al. |
| 6,244,935 B1 | 6/2001 | Birang et al. |
| 6,248,222 B1 | 6/2001 | Wang |
| 6,258,711 B1 | 7/2001 | Laursen |
| 6,258,721 B1 | 7/2001 | Li et al. |
| 6,271,416 B1 | 8/2001 | Takagaki et al. |
| 6,273,786 B1 | 8/2001 | Chopra et al. |
| 6,273,798 B1 | 8/2001 | Berman |
| 6,276,996 B1 | 8/2001 | Chopra |
| 6,297,159 B1 | 10/2001 | Paton |
| 6,303,049 B1 | 10/2001 | Lee et al. |
| 6,303,551 B1 | 10/2001 | Li et al. |
| 6,310,019 B1 | 10/2001 | Kakizawa et al. |
| 6,313,039 B1 | 11/2001 | Small et al. |
| 6,315,803 B1 | 11/2001 | Ina et al. |
| 6,315,883 B1 | 11/2001 | Mayer et al. |
| 6,328,872 B1 | 12/2001 | Talieh et al. |
| 6,348,076 B1 | 2/2002 | Canaperi et al. |
| 6,354,916 B1 | 3/2002 | Uzoh et al. |
| 6,355,075 B1 | 3/2002 | Ina et al. |
| 6,355,153 B1 | 3/2002 | Uzoh et al. |
| 6,358,118 B1 | 3/2002 | Boehm et al. |
| 6,368,184 B1 | 4/2002 | Beckage |
| 6,368,190 B1 | 4/2002 | Easter et al. |
| 6,375,559 B1 | 4/2002 | James et al. |
| 6,375,693 B1 | 4/2002 | Cote et al. |
| 6,379,223 B1 | 4/2002 | Sun et al. |
| 6,381,169 B1 | 4/2002 | Bocian et al. |
| 6,386,956 B1 | 5/2002 | Sato et al. |
| 6,391,166 B1 | 5/2002 | Wang |
| 6,395,152 B1 | 5/2002 | Wang |
| 6,402,591 B1 | 6/2002 | Thornton |
| 6,406,363 B1 | 6/2002 | Xu et al. |
| 6,409,781 B1 | 6/2002 | Wojtczak et al. |
| 6,409,904 B1 | 6/2002 | Uzoh et al. |
| 6,413,388 B1 | 7/2002 | Uzoh et al. |
| 6,413,403 B1 | 7/2002 | Lindquist et al. |
| 6,416,685 B1 | 7/2002 | Zhang et al. |
| 6,419,554 B2 | 7/2002 | Chopra et al. |

| | | |
|---|---|---|
| 6,428,721 B1 | 8/2002 | Ina et al. |
| 6,429,133 B1 | 8/2002 | Chopra |
| 6,432,823 B1 | 8/2002 | Huynh et al. |
| 6,435,945 B1 | 8/2002 | Somekh |
| 6,440,186 B1 | 8/2002 | Sakai et al. |
| 6,440,295 B1 | 8/2002 | Wang |
| 6,444,569 B2 | 9/2002 | Farkas et al. |
| 6,447,371 B2 | 9/2002 | Brusic Kaufman et al. |
| 6,447,668 B1 | 9/2002 | Wang |
| 6,454,819 B1 | 9/2002 | Yano et al. |
| 6,455,479 B1 | 9/2002 | Sahbari |
| 6,468,413 B1 | 10/2002 | Fanti et al. |
| 6,471,847 B2 | 10/2002 | Talieh et al. |
| 6,482,307 B2 | 11/2002 | Ashjaee et al. |
| 6,497,800 B1 | 12/2002 | Talieh et al. |
| 6,508,952 B1 | 1/2003 | Lee et al. |
| 6,551,935 B1 | 4/2003 | Sinha et al. |
| 6,555,158 B1 | 4/2003 | Yoshio et al. |
| 6,562,719 B2 | 5/2003 | Kondo et al. |
| 6,565,619 B1 | 5/2003 | Asano et al. |
| 6,579,153 B2 | 6/2003 | Uchikura et al. |
| 6,582,281 B2 | 6/2003 | Doan et al. |
| 6,593,239 B2 | 7/2003 | Kaufman et al. |
| 6,596,638 B1 | 7/2003 | Kondo et al. |
| 6,602,112 B2 | 8/2003 | Tran et al. |
| 6,605,537 B2 | 8/2003 | Bian et al. |
| 6,612,904 B1 | 9/2003 | Boehm et al. |
| 6,616,976 B2 | 9/2003 | Montano et al. |
| 6,620,215 B2 | 9/2003 | Li et al. |
| 6,630,059 B1 | 10/2003 | Uzoh et al. |
| 6,638,863 B2 | 10/2003 | Wang et al. |
| 6,676,484 B2 | 1/2004 | Chopra |
| 6,679,928 B2 | 1/2004 | Costas et al. |
| 6,679,929 B2 | 1/2004 | Asano et al. |
| 6,693,036 B1 | 2/2004 | Nogami et al. |
| 6,709,316 B1 | 3/2004 | Sun et al. |
| 6,726,823 B1 | 4/2004 | Wang et al. |
| 6,776,693 B2 | 8/2004 | Duboust et al. |
| 6,858,540 B2 | 2/2005 | Sun et al. |
| 6,863,797 B2 | 3/2005 | Sun et al. |
| 6,899,804 B2 | 5/2005 | Duboust et al. |
| 2001/0005667 A1 | 6/2001 | Tolles et al. |
| 2001/0013506 A1 | 8/2001 | Chamberin et al. |
| 2001/0024878 A1 | 9/2001 | Nakamura |
| 2001/0027018 A1 | 10/2001 | Molnar |
| 2001/0036746 A1 | 11/2001 | Sato et al. |
| 2001/0040100 A1 | 11/2001 | Wang |
| 2001/0042690 A1 | 11/2001 | Talieh |
| 2002/0008036 A1 | 1/2002 | Wang |
| 2002/0011417 A1 | 1/2002 | Talieh et al. |
| 2002/0016272 A1 | 2/2002 | Kakizawa et al. |
| 2002/0020621 A1 | 2/2002 | Uzoh et al. |
| 2002/0025760 A1 | 2/2002 | Lee et al. |
| 2002/0025763 A1 | 2/2002 | Lee |
| 2002/0040100 A1 | 4/2002 | Kume et al. |
| 2002/0064769 A1 | 5/2002 | Michnick et al. |
| 2002/0068454 A1 * | 6/2002 | Sun et al. .................... 438/692 |
| 2002/0070126 A1 | 6/2002 | Sato et al. |
| 2002/0072309 A1 | 6/2002 | Sato et al. |
| 2002/0074230 A1 | 6/2002 | Basol |
| 2002/0077037 A1 | 6/2002 | Tietz |
| 2002/0088709 A1 | 7/2002 | Hongo et al. |
| 2002/0088715 A1 | 7/2002 | Talieh et al. |
| 2002/0096659 A1 | 7/2002 | Sakai et al. |
| 2002/0108861 A1 | 8/2002 | Emesh et al. |
| 2002/0119286 A1 | 8/2002 | Chen et al. |
| 2002/0130049 A1 | 9/2002 | Chen et al. |
| 2002/0139055 A1 | 10/2002 | Asano et al. |
| 2002/0160698 A1 | 10/2002 | Sato et al. |
| 2003/0013306 A1 | 1/2003 | Tsai et al. |
| 2003/0013387 A1 | 1/2003 | Tsai |
| 2003/0022501 A1 | 1/2003 | Tsai |
| 2003/0022801 A1 | 1/2003 | Sun et al. |
| 2003/0029841 A1 | 2/2003 | Moon |
| 2003/0036339 A1 | 2/2003 | Bonner |
| 2003/0062833 A1 | 4/2003 | Tai et al. |
| 2003/0073386 A1 | 4/2003 | Ma et al. |
| 2003/0079416 A1 | 5/2003 | Ma et al. |
| 2003/0083214 A1 | 5/2003 | Kakizawa et al. |
| 2003/0104762 A1 | 6/2003 | Sato et al. |
| 2003/0113996 A1 | 6/2003 | Nogami et al. |
| 2003/0114004 A1 | 6/2003 | Sato et al. |
| 2003/0114087 A1 | 6/2003 | Duboust et al. |
| 2003/0116445 A1 | 6/2003 | Sun et al. |
| 2003/0116446 A1 | 6/2003 | Duboust et al. |
| 2003/0120927 A1 | 6/2003 | Kim |
| 2003/0136055 A1 | 7/2003 | Li et al. |
| 2003/0153184 A1 | 8/2003 | Wang et al. |
| 2003/0170091 A1 | 9/2003 | Shomler et al. |
| 2003/0170991 A1 | 9/2003 | Wang et al. |
| 2003/0178320 A1 | 9/2003 | Liu et al. |
| 2003/0213703 A1 | 11/2003 | Wang et al. |
| 2003/0234184 A1 | 12/2003 | Liu et al. |
| 2004/0053499 A1 * | 3/2004 | Liu et al. .................... 438/689 |
| 2004/0134792 A1 | 7/2004 | Butterfield et al. |
| 2005/0092620 A1 | 5/2005 | Mavliev et al. |
| 2005/0173669 A1 | 8/2005 | Kurata et al. |

FOREIGN PATENT DOCUMENTS

| | | |
|---|---|---|
| EP | 0 325 753 | 8/1989 |
| EP | 0 455 455 | 11/1991 |
| EP | 0 527 537 | 2/1993 |
| EP | 0 811 665 | 12/1997 |
| EP | 0 846 742 | 6/1998 |
| EP | 1 006 166 | 6/2000 |
| EP | 1 011 131 | 6/2000 |
| EP | 1 085 067 | 3/2001 |
| EP | 1 093 161 | 4/2001 |
| EP | 1 094 134 | 4/2001 |
| EP | 1 103 346 | 5/2001 |
| EP | 1 104 020 | 5/2001 |
| EP | 1 116 762 | 7/2001 |
| EP | 1 125 999 | 8/2001 |
| EP | 1 170 761 | 9/2002 |
| FR | 1 603 558 | 6/1971 |
| JP | 60 234998 | 11/1985 |
| JP | 11 042554 | 2/1999 |
| JP | 2001-127018 | 5/2001 |
| JP | 2001-139937 | 5/2001 |
| JP | 2001-77117 | 9/2002 |
| KR | 2000-011709 | 2/2000 |
| WO | WO 98/04646 | 2/1998 |
| WO | WO 98/36045 | 8/1998 |
| WO | WO 98/44061 | 8/1998 |
| WO | WO 98/41671 | 9/1998 |
| WO | WO 98/49723 | 11/1998 |
| WO | WO 99/41434 | 8/1999 |
| WO | WO 99/46081 | 9/1999 |
| WO | WO 99/53119 | 10/1999 |
| WO | WO 99/53532 | 10/1999 |
| WO | WO 99/65072 | 12/1999 |
| WO | WO 00/00561 | 1/2000 |
| WO | WO 00/02235 | 1/2000 |
| WO | WO 00/02238 | 1/2000 |
| WO | WO 00/03426 | 1/2000 |
| WO | WO 00/24842 | 5/2000 |
| WO | WO 00/26443 | 5/2000 |
| WO | WO 00/30159 | 5/2000 |
| WO | WO 00/33356 | 6/2000 |
| WO | WO 00/35627 | 6/2000 |
| WO | WO 00/55876 | 9/2000 |
| WO | WO 00/59682 | 10/2000 |
| WO | WO 01/49452 | 7/2001 |
| WO | WO 01/77241 | 10/2001 |
| WO | WO 01/88229 | 11/2001 |

| WO | WO 02/23616 | 3/2002 |
| WO | WO 02/064314 | 8/2002 |
| WO | WO 03/001581 | 1/2003 |
| WO | WO 03/006205 | 1/2003 |
| WO | WO 03/060962 | 7/2003 |
| WO | WO 03/103033 | 12/2003 |
| WO | WO 2004/067660 | 8/2004 |
| WO | WO 2004/111146 | 12/2004 |
| WO | WO 2005/075711 A1 | 8/2005 |

OTHER PUBLICATIONS

Nogami, "*An Innovation to Integrate Porous Low-K Materials and Copper*", InterConnect Japan 2001; Honeywell Seminar (Dec. 6, 2001) pp. 1-12.
Partial International Search Report for US 02/40754 dated Apr. 28, 2003.
Partial Search Report (Form PCT/ISA/206-Annex) for PCT/US02/22126, dated Dec. 6, 2005.
PCT International Preliminary Examination Report for PCT/US02/04806, dated Sep. 7, 2004.
PCT International Preliminary Examination Report for PCT/US03/06058, dated Sep. 7, 2004.
PCT International Search Report for PCT/US 02/11009 dated Feb. 6, 2003.
PCT International Search Report for PCT/US02/00062, dated Jul. 8, 2002.
PCT International Search Report for PCT/US03/01760 dated May 27, 2003.
PCT International Search Report for PCT/US03/29230 dated Feb. 3, 2004.
PCT International Search Report for PCT/US02/04806 dated Apr. 1, 2003.
PCT International Search Report for PCT/US03/06058 dated Jun. 25, 2003.
PCT International Search Report from International Application No. PCT/US01/50150, dated Sep. 23, 2002.
PCT International Search Report from International Application No. PCT/US02/22126, dated Mar. 5, 2003.
PCT International Search Report for PCT/US04/043516 dated Jul. 29, 2005.
PCT Written Opinion dated Feb. 24, 2005 for PCT/US02/22126.
PCT Written Opinion dated Feb. 28, 2005 for PCT/US01/50150.
PCT Written Opinion for International Preliminary Examining Authority for US/02/00062, dated May 12, 2003.
PCT Written Opinion for PCT/US02/04806, dated Mar. 9, 2004.
PCT Written Opinion for PCT/US03/01760 dated Mar. 8, 2004.
PCT Written Opinion for PCT/US03/06058, dated Feb. 13, 2004.
PCT Written Opinion for PCT/US04/043516 dated Jul. 29, 2005.
Robert J. Contolini, "Electrochemical Planarization of ULSI Copper" Jun. 1997, Solid State Technology, pp. 155-156, 158 and 160.
PCT International Search Report and the Written Opinion for International Application No. PCT/US2006/004873, dated Aug. 23, 2006.
PCT International Search Report and the Written Opinion for International Application No. PCT/US2006/003034, dated Jun. 23, 2006.
PCT International Search Report and Written Opinion dated Mar. 30, 2007 for PCT International Application No. PCT/US2006/30381.
US 5,985,755, 11/1999, Bajaj et al. (withdrawn)

\* cited by examiner

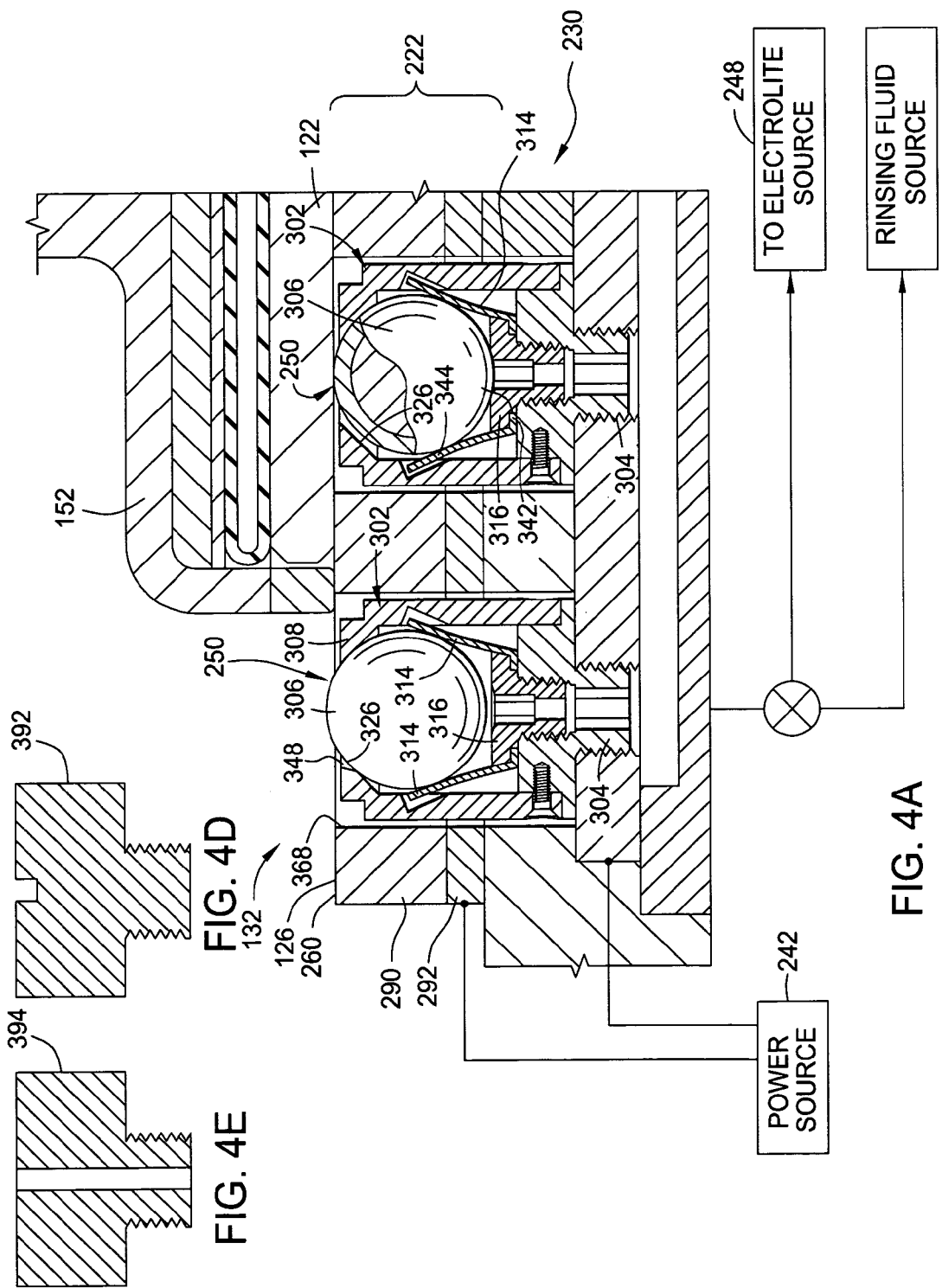

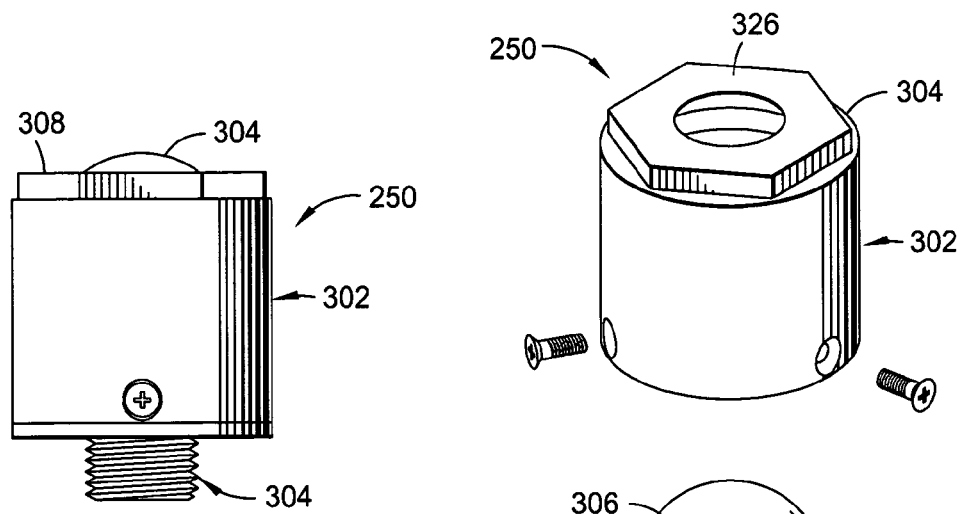
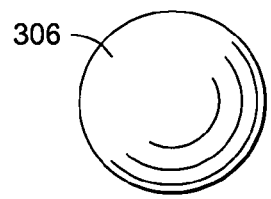
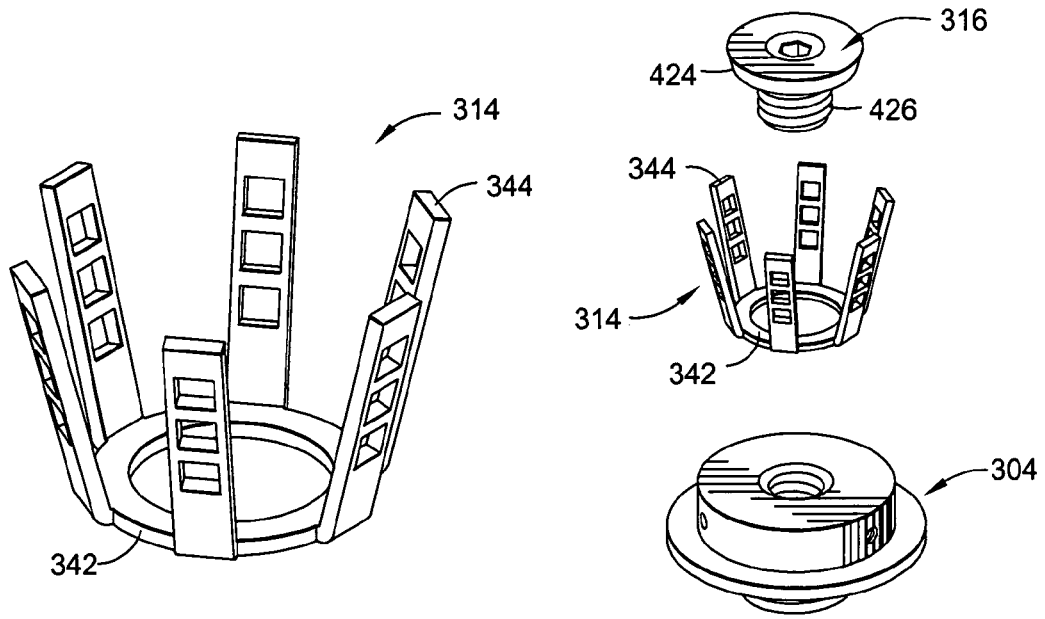
FIG. 5A
FIG. 6
FIG. 5B

METHOD AND COMPOSITION FOR POLISHING A SUBSTRATE

CROSS-REFERENCE TO RELATED APPLICATIONS

This application claims benefit of U.S. Provisional Patent Application Ser. No. 60/572,183, filed May 17, 2004, and claims benefit of U.S. Provisional Patent Application Ser. No. 60/648,128, filed Jan. 28, 2005, and is a continuation-in-part of U.S. patent application Ser. No. 10/948,958, filed Sep. 24, 2004, which claims benefit of U.S. Provisional Patent Application Ser. No. 60/540,265, filed Jan. 29, 2004, all of which are herein incorporated by reference.

BACKGROUND OF THE INVENTION

1. Field of the Invention

Embodiments of the present invention relate to compositions and methods for removing a conductive material from a substrate.

2. Background of the Related Art

Reliably producing sub-half micron and smaller features is one of the key technologies for the next generation of very large scale integration (VLSI) and ultra large-scale integration (ULSI) of semiconductor devices. However, as the limits of circuit technology are pushed, the shrinking dimensions of interconnects in VLSI and ULSI technology have placed additional demands on processing capabilities. Reliable formation of interconnects is important to VLSI and ULSI success and to the continued effort to increase circuit density and quality of individual substrates and die.

Multilevel interconnects are formed using sequential material deposition and material removal techniques on a substrate surface to form features therein. As layers of materials are sequentially deposited and removed, the uppermost surface of the substrate may become non-planar across its surface and require planarization prior to further processing. Planarization or "polishing" is a process in which material is removed from the surface of the substrate to form a generally even, planar surface. Planarization is useful in removing excess deposited material, removing undesired surface topography, and surface defects, such as surface roughness, agglomerated materials, crystal lattice damage, scratches, and contaminated layers or materials to provide an even surface for subsequent photolithography and other semiconductor manufacturing processes.

It is extremely difficult to planarize a metal surface, particularly a tungsten surface, as by chemical mechanical polishing (CMP), which planarizes a layer by chemical activity as well as mechanical activity, of a damascene inlay as shown in FIGS. 1A and 1B, with a high degree of surface planarity. A damascene inlay formation process may include etching feature definitions 11 in an interlayer dielectric 10, such as a silicon oxide layer, depositing a barrier layer 13 in the feature definitions 11 and on a surface of the substrate, and depositing a thick layer of conductive material 12, such as tungsten, on the barrier layer 13 and substrate surface. The tungsten material 12 is chemical mechanically polished to expose the barrier layer. The barrier layer is then chemical mechanically polished to remove the barrier layer to expose the oxide layer 10 and filled feature definitions 11 as shown in FIG. 1A. Chemical mechanical polishing techniques to completely remove the barrier layer material often results in topographical defects, such as dishing and erosion, that may affect subsequent processing of the substrate.

Dishing occurs when a portion of the surface of the inlaid metal of the interconnection formed in the feature definitions in the interlayer dielectric is excessively polished, resulting in one or more concave depressions, which may be referred to as concavities or recesses. Referring to FIG. 1A, a damascene inlay of tungsten 12 in feature definitions 11 are formed with a barrier layer 13 in a damascene feature definition 11 formed in interlayer dielectric 10, for example, silicon dioxide. Subsequent to planarization, a portion of the tungsten 12 may be depressed by an amount D, referred to as the amount of dishing. Dishing is more likely to occur in wider or less dense features on a substrate surface.

Conventional planarization techniques also sometimes result in erosion, characterized by excessive polishing of the layer not targeted for removal, such as a dielectric layer 10 surrounding a filled feature definition. Referring to FIG. 1B, a tungsten fill 21 with a barrier layer 23 formed in a dense array of feature definitions 22 are inlaid in interlayer dielectric 20. Polishing the substrate may result in loss, or erosion E, of the dielectric 20 between the tungsten filled feature definitions. Erosion is observed to occur near narrower or more dense features formed in the substrate surface.

Therefore, there is a need for compositions and methods for removing conductive material, such as excess conductive material and barrier material, from a substrate that minimizes the formation of topographical defects to the substrate during planarization.

SUMMARY OF THE INVENTION

Aspects of the invention provide compositions and methods for removing barrier materials by a polishing technique. In one aspect, a composition is provided for removing at least a barrier material from a substrate surface including between about 1 wt. % and about 10 wt. % of an oxidizer, between about 0.5 wt. % and about 5 wt. % of a chelating agent, between about 0.0001 wt % and about 1 wt % of a polymeric stabilizer, between about 0.3 wt % and about 10 wt % of abrasive particles, a pH between about 1 and about 6, and a solvent.

In another aspect, the composition is used in a method provided for processing a substrate including disposing a substrate having patterned feature definitions, a barrier material disposed in the patterned feature definition, and a tungsten layer formed thereon in a polishing apparatus, polishing the tungsten layer to expose the barrier layer, polishing the barrier layer by a process comprising providing a polishing composition comprising between about 1 wt. % and about 10 wt. % of an oxidizer, between about 0.5 wt. % and about 5 wt. % of a chelating agent, between about 0.0001 wt % and about 1 wt % of a polymeric stabilizer, between about 0.3 wt % and about 10 wt % of abrasive particles, a pH between about 1 and about 6 and a solvent, and contacting the substrate to a polishing article, providing relative motion between the substrate and the polishing article, and removing barrier material from the substrate.

In another aspect, a method is provided for processing a substrate including disposing a substrate having patterned feature definitions, a barrier material disposed in the patterned feature definition, and a tungsten layer formed thereon in a polishing apparatus having at least one electrochemical mechanical polishing station and at least one chemical mechanical polishing station, polishing the substrate in the at least one electrochemical mechanical polishing station to remove a first portion of the tungsten layer by a process comprising providing a first polishing composition between the first electrode and the substrate, contacting the substrate to a polishing article at a first pressure between the substrate and the polishing article, providing a first relative motion between the substrate and the polishing article, and applying a first bias between the first electrode and the second electrode, and polishing the substrate in the at least one electrochemical mechanical polishing station to remove a second portion of the tungsten layer by a process comprising providing a second polishing composition between the first electrode and the substrate, contacting the substrate to a polishing article at a second pressure between the substrate and the polishing article, providing a second relative motion between the substrate and the polishing article, and applying a second bias between the first electrode and the second electrode, and polishing the barrier layer by a process comprising providing a polishing composition comprising between about 1 wt. % and about 10 wt. % of an oxidizer, between about 0.5 wt. % and about 5 wt. % of a chelating agent, between about 0.0001 wt % and about 1 wt % of a polymeric stabilizer, between about 0.3 wt % and about 10 wt % of abrasive particles, a pH between about 1 and about 6, and a solvent, and contacting the substrate to a polishing article, providing relative motion between the substrate and the polishing article, and removing barrier material from the substrate.

In another aspect, a composition is provided for removing at least a barrier material from a substrate surface including an acid based electrolyte system, one or more etching agents, one or more etching inhibitors, one or more activating agents, one or more pH adjusting agents to provide a pH between about 2 and about 7, one or more oxidizers, abrasive particles, and a solvent.

In another aspect, a method provided for processing a substrate including a dielectric surface, feature definitions formed in the dielectric surface, a barrier material disposed in the feature definitions and the dielectric surface, and a conductive material disposed on the barrier material, the method including polishing the conductive material to expose the barrier material, disposing the substrate in a process apparatus comprising a first electrode and a second electrode, wherein the substrate is in electrical contact with the second electrode, providing a polishing composition between the first electrode and the substrate, wherein the polishing composition includes an acid based electrolyte system, one or more etching agents, one or more etching inhibitors, one or more activating agents, one or more pH adjusting agents to provide a pH between about 2 and about 7, one or more oxidizers, abrasive particles, and a solvent, applying a pressure between the substrate and a polishing article by use of a polishing head, providing relative motion between the substrate and the polishing article by mechanical means, applying a bias between the first electrode and the second electrode, and removing barrier material from the dielectric surface.

BRIEF DESCRIPTION OF THE DRAWINGS

So that the manner in which the above recited aspects of the present invention are attained and can be understood in detail, a more particular description of embodiments of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 4A is a partial sectional view of the first ECMP station through two contact assemblies;

FIGS. 4D-E are sectional views of plugs;

FIGS. 5A and 5B are side, exploded and sectional views of one embodiment of a contact assembly;

FIG. 6 is one embodiment of a contact element;

DETAILED DESCRIPTION OF THE PREFERRED EMBODIMENT

In general, aspects of the invention provide compositions and methods for removing conductive materials and barrier materials from a substrate surface. The invention is described below in reference to a planarizing process for the removal of conductive material and barrier material from a substrate surface by an electrochemical mechanical polishing (ECMP) technique.

The words and phrases used herein should be given their ordinary and customary meaning in the art by one skilled in the art unless otherwise further defined. Chemical polishing should be broadly construed and includes, but is not limited to, planarizing a substrate surface using chemical activity. Electropolishing should be broadly construed and includes, but is not limited to, planarizing a substrate by the application of electrochemical activity. Electrochemical mechanical polishing (ECMP) should be broadly construed and includes planarizing a substrate by the application of electrochemical activity, mechanical activity, and chemical activity to remove material from a substrate surface.

Anodic dissolution should be broadly construed and includes, but is not limited to, the application of an anodic bias to a substrate directly or indirectly which results in the removal of conductive material from a substrate surface and into a surrounding polishing composition. Polishing composition should be broadly construed and includes, but is not limited to, a composition that provides ionic conductivity, and thus, electrical conductivity, in a liquid medium, which generally comprises materials known as electrolyte components. The amount of each electrolyte component in polishing compositions can be measured in volume percent or weight percent. Volume percent refers to a percentage based on volume of a desired liquid component divided by the total volume of all of the liquid in the complete composition. A percentage based on weight percent is the weight of the desired component divided by the total weight of all of the liquid components in the complete composition.

The electrochemical mechanical polishing process may be performed in a process apparatus, such as a platform having one or more polishing stations adapted for electrochemical mechanical polishing processes. The one or more polishing stations may be adapted to perform conventional chemical mechanical polishing. A platen for performing an electrochemical mechanical polishing process may include a polishing article, a first electrode, and a second electrode, wherein the substrate is in electrical contact with the second electrode.

An example of a suitable system is the Reflexion Lk Ecmp™ processing system, commercially available from Applied Materials, Inc., of Santa Clara, Calif. The following apparatus description is illustrative and should not be construed or interpreted as limiting the scope of the invention.

One Apparatus Embodiment

Figure 2:
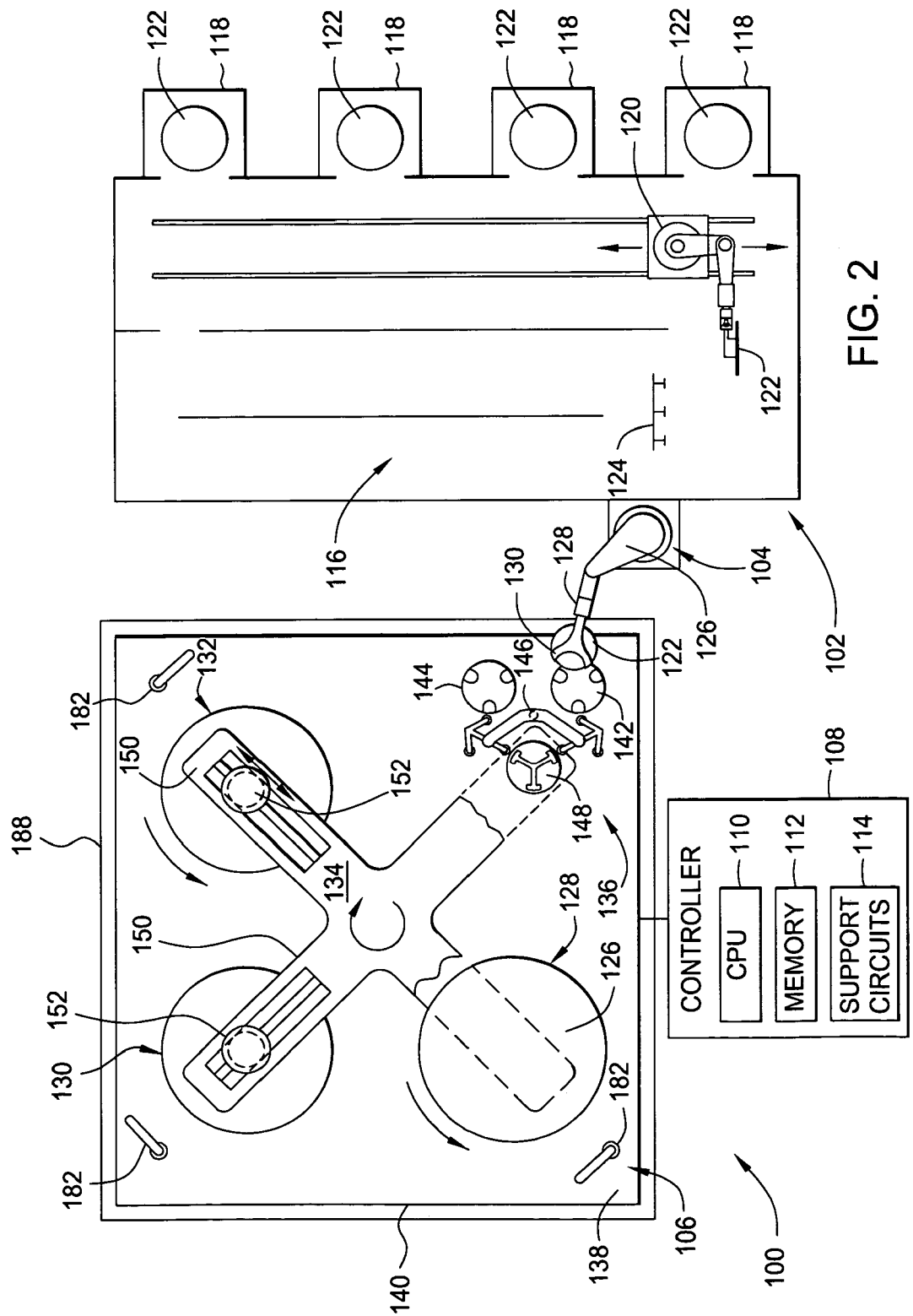
FIG. 2 is a plan view of an electrochemical mechanical planarizing system.

FIG. 2 is a plan view of one embodiment of a planarization system 100 having an apparatus for electrochemically processing a substrate. The exemplary system 100 generally comprises a factory interface 102, a loading robot 104, and a planarizing module 106. The loading robot 104 is disposed proximate the factory interface 102 and the planarizing module 106 to facilitate the transfer of substrates 122 therebetween.

A controller 108 is provided to facilitate control and integration of the modules of the system 100. The controller 108 comprises a central processing unit (CPU) 110, a memory 112, and support circuits 114. The controller 108 is coupled to the various components of the system 100 to facilitate control of, for example, the planarizing, cleaning, and transfer processes.

The factory interface 102 generally includes a cleaning module 116 and one or more wafer cassettes 118. An interface robot 120 is employed to transfer substrates 122 between the wafer cassettes 118, the cleaning module 116 and an input module 124. The input module 124 is positioned to facilitate transfer of substrates 122 between the planarizing module 106 and the factory interface 102 by grippers, for example vacuum grippers or mechanical clamps (not shown).

The planarizing module 106 includes at least a first electrochemical mechanical planarizing (ECMP) station 128, disposed in an environmentally controlled enclosure 188. Examples of planarizing modules 106 that can be adapted to benefit from the invention include MIRRA® Chemical Mechanical Planarizing Systems, MIRRA MESA™ Chemical Mechanical Planarizing Systems, REFLEXION® Chemical Mechanical Planarizing Systems, REFLEXION® LK Chemical Mechanical Planarizing Systems, and REFLEXION LK ECMP™ Chemical Mechanical Planarizing Systems, all available from Applied Materials, Inc. of Santa Clara, Calif. Other planarizing modules, including those that use processing pads, planarizing webs, or a combination thereof, and those that move a substrate relative to a planarizing surface in a rotational, linear or other planar motion may also be adapted to benefit from the invention.

In the embodiment depicted in FIG. 2, the planarizing module 106 includes one bulk ECMP station 128, a second ECMP station 130 and third polishing station 132. The third polishing station may be an ECMP station as described for ECMP stations 128 or 130 as shown in FIG. 2, and may alternatively, be a chemical mechanical polishing (CMP) station. As CMP stations are conventional in nature, further description thereof has been omitted for the sake of brevity. However, an example of a suitable CMP polishing station is more fully described in U.S. Pat. No. 5,738,574, issued on Apr. 14, 1998, entitled, "Continuous Processing System for Chemical Mechanical Polishing," the entirety of which is incorporated herein by reference to the extent not inconsistent with the invention Bulk removal of conductive material from the substrate is performed through an electrochemical dissolution process at the bulk ECMP station 128. After the bulk material removal at the bulk ECMP station 128, residual conductive material is removed from the substrate at the residual ECMP station 130 through a second electrochemical mechanical process. It is contemplated that more than one residual ECMP stations 130 may be utilized in the planarizing module 106. Barrier layer material may be removed at polishing station 132 after processing at the residual ECMP station 130 by the barrier removal processes described herein. Alternatively, each of the first and second ECMP stations 128, 130 may be utilized to perform both the two-step conductive material removal as described herein on a single station.

The exemplary planarizing module 106 also includes a transfer station 136 and a carousel 134 that are disposed on an upper or first side 138 of a machine base 140. In one embodiment, the transfer station 136 includes an input buffer station 142, an output buffer station 144, a transfer robot 146, and a load cup assembly 148. The input buffer station 142 receives substrates from the factory interface 102 by means of the loading robot 104. The loading robot 104 is also utilized to return polished substrates from the output buffer station 144 to the factory interface 102. The transfer robot 146 is utilized to move substrates between the buffer stations 142, 144 and the load cup assembly 148.

In one embodiment, the transfer robot 146 includes two gripper assemblies (not shown), each having pneumatic gripper fingers that hold the substrate by the substrate's edge. The transfer robot 146 may simultaneously transfer a substrate to be processed from the input buffer station 142 to the load cup assembly 148 while transferring a processed substrate from the load cup assembly 148 to the output buffer station 144. An example of a transfer station that may be used to advantage is described in U.S. Pat. No. 6,156,124, issued Dec. 5, 2000 to Tobin, which is herein incorporated by reference in its entirety.

The carousel 134 is centrally disposed on the base 140. The carousel 134 typically includes a plurality of arms 150, each supporting a planarizing head assembly 152. Two of the arms 150 depicted in FIG. 2 are shown in phantom such that the transfer station 136 and a planarizing surface 126 of the first ECMP station 128 may be seen. The carousel 134 is indexable such that the planarizing head assemblies 152 may be moved between the planarizing stations 128, 130, 132 and the transfer station 136. One carousel that may be utilized to advantage is described in U.S. Pat. No. 5,804,507, issued Sep. 8, 1998 to Perlov, et al., which is hereby incorporated by reference in its entirety.

A conditioning device 182 is disposed on the base 140 adjacent each of the planarizing stations 128, 130, 132. The conditioning device 182 periodically conditions the planarizing material disposed in the stations 128, 130, 132 to maintain uniform planarizing results.

Figure 3:
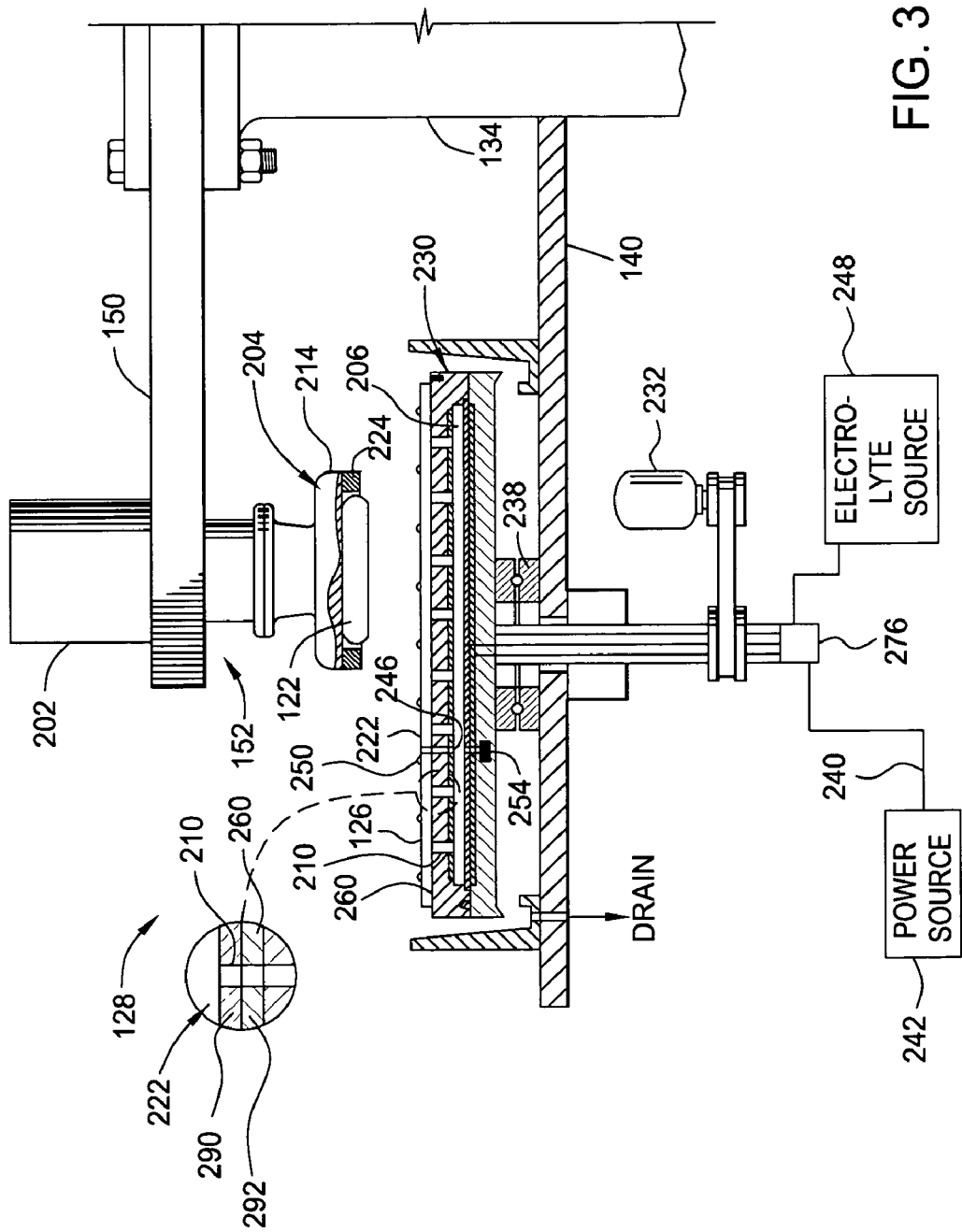
FIG. 3 is a sectional view of one embodiment of a first electrochemical mechanical planarizing (ECMP) station of the system of FIG. 2.

FIG. 3 depicts a sectional view of one of the planarizing head assemblies 152 positioned over one embodiment of the bulk ECMP station 128. The planarizing head assembly 152 generally comprises a drive system 202 coupled to a planarizing head 204. The drive system 202 generally provides at least rotational motion to the planarizing head 204. The planarizing head 204 additionally may be actuated toward the bulk ECMP station 128 such that the substrate 122 retained in the planarizing head 204 may be disposed against the planarizing surface 126 of the bulk ECMP station 128 during processing. The drive system 202 is coupled to the controller 108 that provides a signal to the drive system 202 for controlling the rotational speed and direction of the planarizing head 204.

In one embodiment, the planarizing head may be a TITAN HEAD™ or TITAN PROFILER™ wafer carrier manufactured by Applied Materials, Inc. Generally, the planarizing head 204 comprises a housing 214 and retaining ring 224 that defines a center recess in which the substrate 122 is retained. The retaining ring 224 circumscribes the substrate 122 disposed within the planarizing head 204 to prevent the substrate from slipping out from under the planarizing head 204 while processing. The retaining ring 224 can be made of plastic materials such as polyphenylene sulfide (PPS), polyetheretherketone (PEEK), and the like, or conductive materials such as stainless steel, Cu, Au, Pd, and the like, or some combination thereof. It is further contemplated that a conductive retaining ring 224 may be electrically biased to control the electric field during ECMP. Conductive or biased retaining rings tend to slow the polishing rate proximate the edge of the substrate. It is contemplated that other planarizing heads may be utilized.

The first ECMP station 128 generally includes a platen assembly 230 that is rotationally disposed on the base 140. The platen assembly 230 is supported above the base 140 by a bearing 238 so that the platen assembly 230 may be rotated relative to the base 140. An area of the base 140 circumscribed by the bearing 238 is open and provides a conduit for the electrical, mechanical, pneumatic, control signals and connections communicating with the platen assembly 230.

Conventional bearings, rotary unions and slip rings, collectively referred to as rotary coupler 276, are provided such that electrical, mechanical, fluid, pneumatic, control signals and connections may be coupled between the base 140 and the rotating platen assembly 230. The platen assembly 230 is typically coupled to a motor 232 that provides the rotational motion to the platen assembly 230. The motor 232 is coupled to the controller 108 that provides a signal for controlling for the rotational speed and direction of the platen assembly 230.

A top surface 260 of the platen assembly 230 supports a processing pad assembly 222 thereon. The processing pad assembly may be retained to the platen assembly 230 by magnetic attraction, vacuum, clamps, adhesives and the like.

A plenum 206 is defined in the platen assembly 230 to facilitate uniform distribution of electrolyte to the planarizing surface 126. A plurality of passages, described in greater detail below, are formed in the platen assembly 230 to allow electrolyte, provided to the plenum 206 from an electrolyte source 248, to flow uniformly though the platen assembly 230 and into contact with the substrate 122 during processing. It is contemplated that different electrolyte compositions may be provided during different stages of processing.

The processing pad assembly 222 includes an electrode 292 and at least a planarizing portion 290. The electrode 292 is typically comprised of a conductive material, such as stainless steel, copper, aluminum, gold, silver and tungsten, among others. The electrode 292 may be solid, impermeable to electrolyte, permeable to electrolyte or perforated. At least one contact assembly 250 extends above the processing pad assembly 222 and is adapted to electrically couple the substrate being processed on the processing pad assembly 222 to the power source 242. The electrode 292 is also coupled to the power source 242 so that an electrical potential may be established between the substrate and electrode 292.

A meter (not shown) is provided to detect a metric indicative of the electrochemical process. The meter may be coupled or positioned between the power source 242 and at least one of the electrode 292 or contact assembly 250. The meter may also be integral to the power source 242. In one embodiment, the meter is configured to provide the controller 108 with a metric indicative of processing, such a charge, current and/or voltage. This metric may be utilized by the controller 108 to adjust the processing parameters in-situ or to facilitate endpoint or other process stage detection.

A window 246 is provided through the pad assembly 222 and/or platen assembly 230, and is configured to allow a sensor 254, positioned below the pad assembly 222, to sense a metric indicative of polishing performance. For example, the sensor 704 may be an eddy current sensor or an interferometer, among other sensors. The metric, provided by the sensor 254 to the controller 108, provides information that may be utilized for processing profile adjustment in-situ, endpoint detection or detection of another point in the electrochemical process. In one embodiment, the sensor 254 an interferometer capable of generating a collimated light beam, which during processing, is directed at and impinges on a side of the substrate 122 that is being polished. The interference between reflected signals is indicative of the thickness of the conductive layer of material being processed. One sensor that may be utilized to advantage is described in U.S. Pat. No. 5,893,796, issued Apr. 13, 1999, to Birang, et al., which is hereby incorporated by reference in its entirety.

Embodiments of the processing pad assembly 222 suitable for removal of conductive material from the substrate 122 may generally include a planarizing surface 126 that is substantially dielectric. Other embodiments of the processing pad assembly 222 suitable for removal of conductive material from the substrate 122 may generally include a planarizing surface 126 that is substantially conductive. At least one contact assembly 250 is provided to couple the substrate to the power source 242 so that the substrate may be biased relative to the electrode 292 during processing. Apertures 210, formed through the planarizing layer 290 and the electrode 292 and the any elements disposed below the electrode, allow the electrolyte to establish a conductive path between the substrate 112 and electrode 292.

In one embodiment, the planarizing portion 290 of the processing pad assembly 222 is a dielectric, such as polyurethane. Examples of processing pad assemblies that may be adapted to benefit from the invention are described in U.S. patent application Ser. No. 10/455,941, filed Jun. 6, 2003, entitled "Conductive Planarizing Article For Electrochemical Mechanical Planarizing", and U.S. patent application Ser. No. 10/455,895, filed Jun. 6, 2003, entitled "Conductive Planarizing Article For Electrochemical Mechanical Planarizing," both of which are hereby incorporated by reference in their entireties.

Figure 4B:
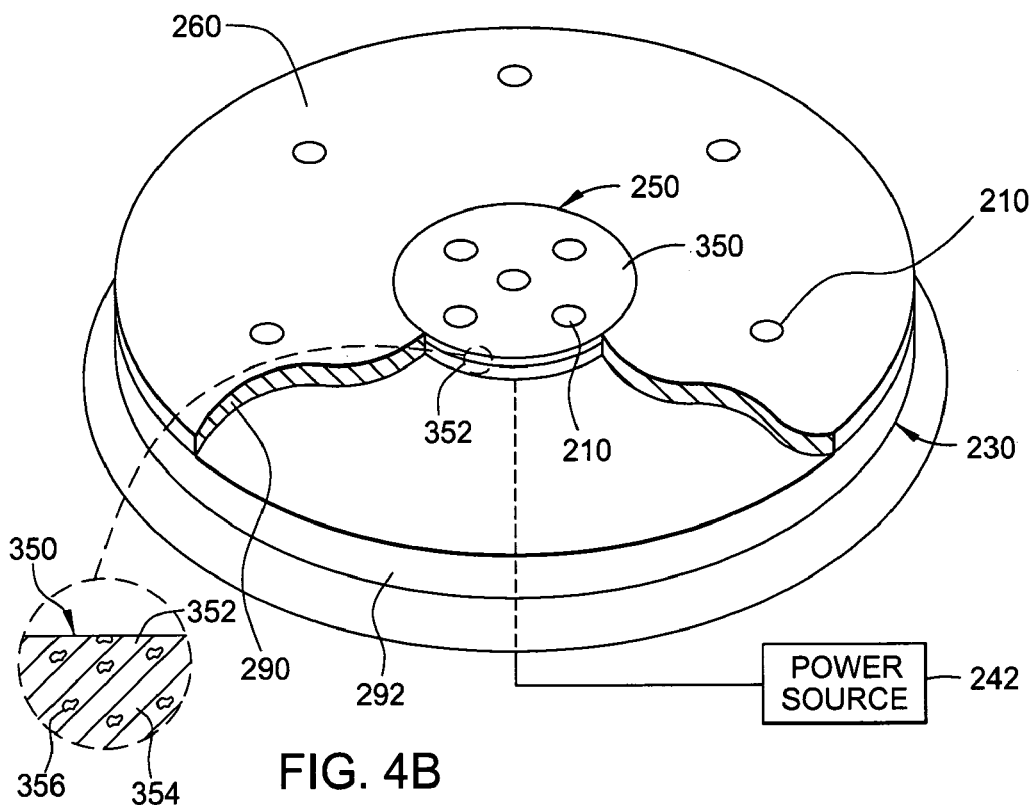
FIGS. 4B-C are sectional views of alternative embodiments of contact assemblies.
Figure 4C:
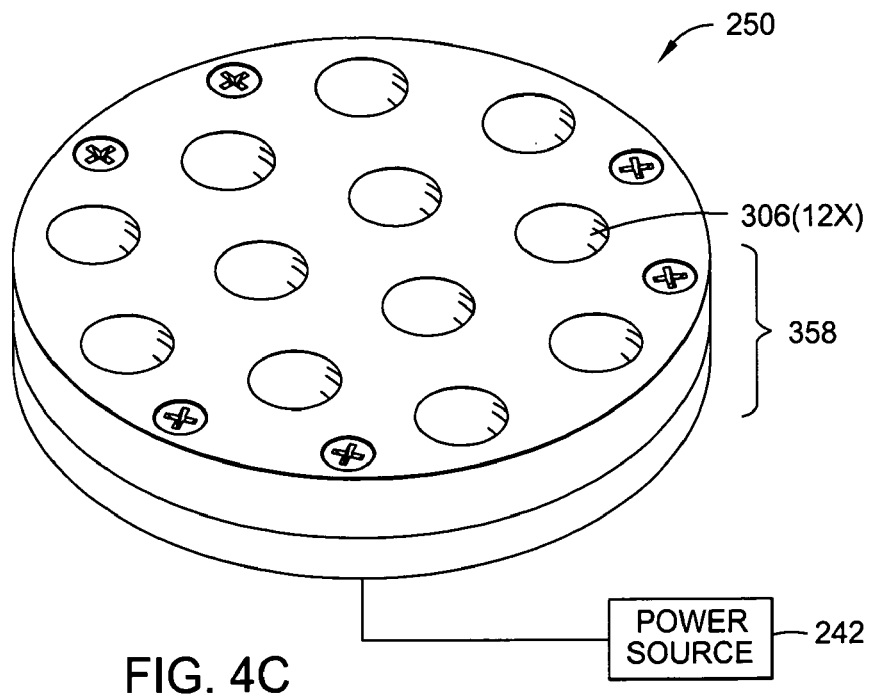

FIG. 4A is a partial sectional view of the first ECMP station 128 through two contact assemblies 250, and FIGS. 5A-C are side, exploded and sectional views of one of the contact assemblies 250 shown in FIG. 5A. The platen assembly 230 includes at least one contact assembly 250 projecting therefrom and coupled to the power source 242 that is adapted to bias a surface of the substrate 122 during processing. The contact assemblies 250 may be coupled to the platen assembly 230, part of the processing pad assembly 222, or a separate element. Although two contact assemblies 250 are shown in FIG. 3A, any number of contact assemblies may be utilized and may be distributed in any number of configurations relative to the centerline of the platen assembly 230.

The contact assemblies 250 are generally electrically coupled to the power source 242 through the platen assembly 230 and are movable to extend at least partially through respective apertures 368 formed in the processing pad assembly 222. The positions of the contact assemblies 250 may be chosen to have a predetermined configuration across the platen assembly 230. For predefined processes, individual contact assemblies 250 may be repositioned in different apertures 368, while apertures not containing contact assemblies may be plugged with a stopper 392 or filled with a nozzle 394 (as shown in FIGS. 4D-E) that allows flow of electrolyte from the plenum 206 to the substrate. One contact assembly that may be adapted to benefit from the invention is described in U.S. patent application Ser. No. 10/445,239, filed May 23, 2003, by Butterfield, et al., and is hereby incorporated by reference in its entirety.

Although the embodiments of the contact assembly 250 described below with respect to FIG. 3A depicts a rolling ball contact, the contact assembly 250 may alternatively comprise a structure or assembly having a conductive upper layer or surface suitable for electrically biasing the substrate 122 during processing. For example, as depicted in FIG. 3B, the contact assembly 250 may include a pad structure 350 having an upper layer 352 made from a conductive material or a conductive composite (i.e., the conductive elements are dispersed integrally with or comprise the material comprising the upper surface), such as a polymer matrix 354 having conductive particles 356 dispersed therein or a conductive coated fabric, among others. The pad structure 350 may include one or more of the apertures 210 formed therethrough for electrolyte delivery to the upper surface of the pad assembly. Other examples of suitable contact assemblies are described in U.S. Provisional Patent Application Ser. No. 60/516,680, filed Nov. 3, 2003, by Hu, et al., which is hereby incorporated by reference in its entirety.

In one embodiment, each of the contact assemblies 250 includes a hollow housing 302, an adapter 304, a ball 306, a contact element 314 and a clamp bushing 316. The ball 306 has a conductive outer surface and is movably disposed in the housing 302. The ball 306 may be disposed in a first position having at least a portion of the ball 306 extending above the planarizing surface 126 and at least a second position where the ball 306 is substantially flush with the planarizing surface 126. It is also contemplated that the ball 306 may move completely below the planarizing surface 126. The ball 306 is generally suitable for electrically coupling the substrate 122 to the power source 242. It is contemplated that a plurality of balls 306 for biasing the substrate may be disposed in a single housing 358 as depicted in FIG. 3C.

The power source 242 generally provides a positive electrical bias to the ball 306 during processing. Between planarizing substrates, the power source 242 may optionally apply a negative bias to the ball 306 to minimize attack on the ball 306 by process chemistries.

The housing 302 is configured to provide a conduit for the flow of electrolyte from the source 248 to the substrate 122 during processing. The housing 302 is fabricated from a dielectric material compatible with process chemistries. A seat 326 formed in the housing 302 prevents the ball 306 from passing out of the first end 308 of the housing 302. The seat 326 optionally may include one or more grooves 348 formed therein that allow fluid flow to exit the housing 302 between the ball 306 and seat 326. Maintaining fluid flow past the ball 306 may minimize the propensity of process chemistries to attack the ball 306.

The contact element 314 is coupled between the clamp bushing 316 and the adapter 304. The contact element 314 is generally configured to electrically connect the adapter 304 and ball 306 substantially or completely through the range of ball positions within the housing 302. In one embodiment, the contact element 314 may be configured as a spring form.

In the embodiment depicted in FIGS. 4A-E and 5A-C and detailed in FIG. 6, the contact element 314 includes an annular base 342 having a plurality of flexures 344 extending therefrom in a polar array. The flexure 344 is generally fabricated from a resilient and conductive material suitable for use with process chemistries. In one embodiment, the flexure 344 is fabricated from gold plated beryllium copper.

Returning to FIGS. 4A and 5A-B, the clamp bushing 316 includes a flared head 424 having a threaded post 422 extending therefrom. The clamp bushing 316 may be fabricated from either a dielectric or conductive material, or a combination thereof, and in one embodiment, is fabricated from the same material as the housing 302. The flared head 424 maintains the flexures 344 at an acute angle relative to the centerline of the contact assembly 250 so that the flexures 344 of the contact elements 314 are positioned to spread around the surface of the ball 306 to prevent bending, binding and/or damage to the flexures 344 during assembly of the contact assembly 250 and through the range of motion of the ball 306.

The ball 306 may be solid or hollow and is typically fabricated from a conductive material. For example, the ball 306 may be fabricated from a metal, conductive polymer or a polymeric material filled with conductive material, such as metals, conductive carbon or graphite, among other conductive materials. Alternatively, the ball 306 may be formed from a solid or hollow core that is coated with a conductive material. The core may be non-conductive and at least partially coated with a conductive covering.

The ball 306 is generally actuated toward the planarizing surface 126 by at least one of spring, buoyant or flow forces. In the embodiment depicted in FIG. 5, flow through the passages formed through the adapter 304 and clamp bushing 316 and the platen assembly 230 from the electrolyte source 248 urge the ball 306 into contact with the substrate during processing.

Figure 7:
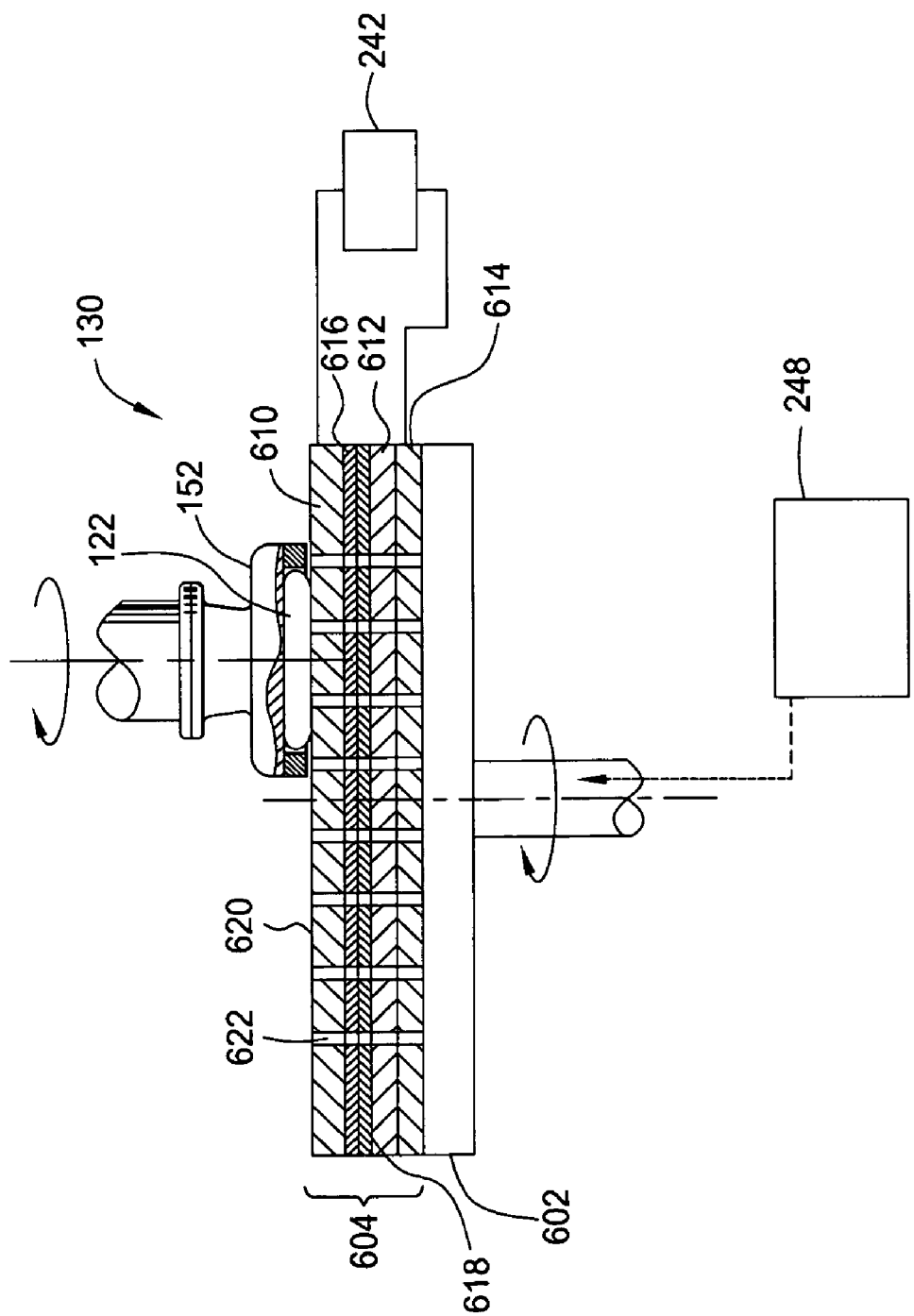
FIG. 7 is a vertical sectional view of another embodiment of an ECMP station.

FIG. 7 is a sectional view of one embodiment of the second ECMP station 130. The first and third ECMP stations 128, 132 may be configured similarly. The second ECMP station 130 generally includes a platen 602 that supports a fully conductive processing pad assembly 604. The platen 602 may be configured similar to the platen assembly 230 described above to deliver electrolyte through the processing pad assembly 604, or the platen 602 may have a fluid delivery arm (not shown) disposed adjacent thereto configured to supply electrolyte to a planarizing surface of the processing pad assembly 604. The platen assembly 602 includes at least one of a meter or sensor 254 (shown in FIG. 3) to facilitate endpoint detection.

In one embodiment, the processing pad assembly 604 includes interposed pad 612 sandwiched between a conductive pad 610 and an electrode 614. The conductive pad 610 is substantially conductive across its top processing surface and is generally made from a conductive material or a conductive composite (i.e., the conductive elements are dispersed integrally with or comprise the material comprising the planarizing surface), such as a polymer matrix having conductive particles dispersed therein or a conductive coated fabric, among others. The conductive pad 610, the interposed pad 612, and the electrode 614 may be fabricated into a single, replaceable assembly. The processing pad assembly 604 is generally permeable or perforated to allow electrolyte to pass between the electrode 614 and top surface 620 of the conductive pad 610. In the embodiment depicted in FIG. 7, the processing pad assembly 604 is perforated by apertures 622 to allow electrolyte to flow therethrough. In one embodiment, the conductive pad 610 is comprised of a conductive material disposed on a polymer matrix disposed on a conductive fiber, for example, tin particles in a polymer matrix disposed on a woven copper coated polymer. The conductive pad 610 may also be utilized for the contact assembly 250 in the embodiment of FIG. 3.

A conductive foil 616 may additionally be disposed between the conductive pad 610 and the subpad 612. The foil 616 is coupled to a power source 242 and provides uniform distribution of voltage applied by the source 242 across the conductive pad 610. In embodiments not including the conductive foil 616, the conductive pad 610 may be coupled directly, for example, via a terminal integral to the pad 610, to the power source 242. Additionally, the pad assembly 604 may include an interposed pad 618, which, along with the foil 616, provides mechanical strength to the overlying conductive pad 610. Examples of suitable pad assemblies are described in the previously incorporated U.S. patent application Ser. Nos. 10/455,941 and 10/455,895.

Electrochemical Mechanical Processing:

In one aspect, polishing compositions and processes that can planarize conductive materials, such as tungsten, and barrier material, such as titanium and titanium nitride are provided. An electrochemical mechanical polishing technique using a combination of chemical activity, mechanical activity and electrical activity to remove conductive material, such as tungsten or copper, and planarize a substrate surface may be performed as described herein. Tungsten material includes tungsten, tungsten nitride, tungsten silicon nitride, and tungsten silicon nitride, among others. While the following conductive material removal process is described for tungsten removal, the invention contemplates the removal of other conductive materials, for example, aluminum, platinum, copper, cobalt, gold, silver, ruthenium, or combinations thereof.

The removal of excess tungsten may be performed in one or more processing steps, for example, a single tungsten removal step or a bulk tungsten removal step and a residual tungsten removal step. Bulk material is broadly defined herein as any material deposited on the substrate in an amount more than sufficient to substantially fill features formed on the substrate surface. Residual material is broadly defined as any material remaining after one or more bulk or residual polishing process steps. Generally, the bulk removal during a first ECMP process removes at least about 50% of the conductive layer, preferably at least about 70%, more preferably at least about 80%, for example, at least about 90%. The residual removal during a second ECMP process removes most, if not all the remaining conductive material disposed on the barrier layer to leave behind the filled plugs.

The bulk removal ECMP process may be performed on a first polishing platen and the residual removal ECMP process on a second polishing platen of the same or different polishing apparatus as the first platen. In another embodiment, the residual removal ECMP process may be performed on the first platen with the bulk removal process. Any barrier material may be removed on a separate platen, such as the third platen in the apparatus described in FIG. 2. For example, the apparatus described above in accordance with the processes described herein may include three platens for removing tungsten material including, for example, a first platen to remove bulk material, a second platen for residual removal and a third platen for barrier removal, wherein the bulk and the residual processes are ECMP processes and the barrier removal is a CMP process, or, alternatively, another ECMP process. In another embodiment, three ECMP platens may be used to remove bulk material, residual removal and barrier removal.

Methods are also provided for polishing a substrate to remove barrier materials from a substrate surface with minimal topographical defects while increasing throughput with a decrease in polishing time. The barrier layer material removal techniques may be performed by a chemical mechanical polishing technique or an electrochemical mechanical polishing technique. A chemical mechanical polishing technique using a combination of chemical activity and mechanical activity, and alternatively an electrochemical mechanical technique, electrical activity, to remove a barrier material and planarize a substrate surface may be performed as described herein. Barrier materials include titanium, titanium nitride, titanium silicon nitride, tantalum, tantalum nitride, tantalum silicon nitride, ruthenium, and combinations thereof.

The barrier layer may be removed in one or more steps, with two or more steps including chemical mechanical polishing, electrochemical mechanical polishing or a combination of both. For example, in electrochemical mechanical polishing of the barrier layer, the second step may include a conventional chemical mechanical polishing process or a second electrochemical mechanical polishing process. The second and subsequent steps may be performed with a polishing composition different the polishing composition described herein as well as a version of the composition described herein diluted with a solvent or other material.

Figure 8A:
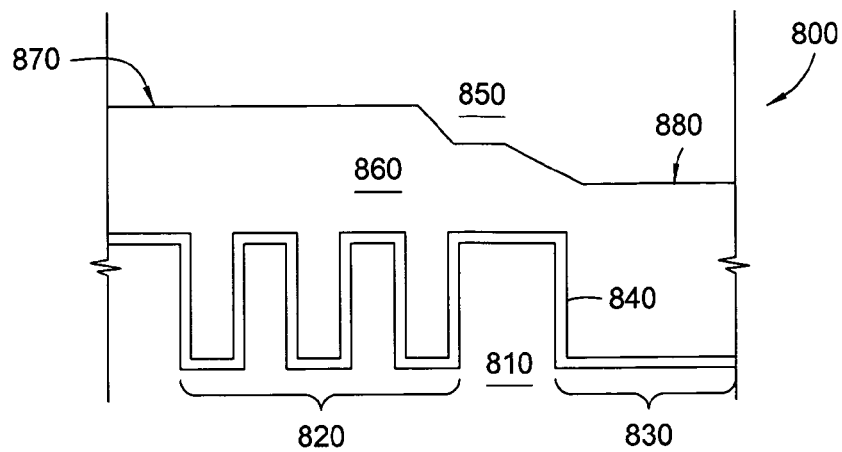
FIGS. 8A-8D are schematic cross-sectional views illustrating a polishing process performed on a substrate according to one embodiment.
Figure 8B:
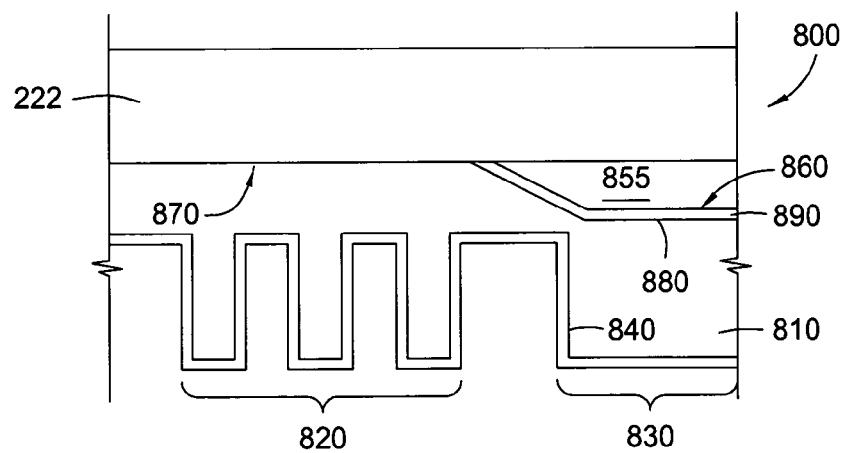
Figure 8C:
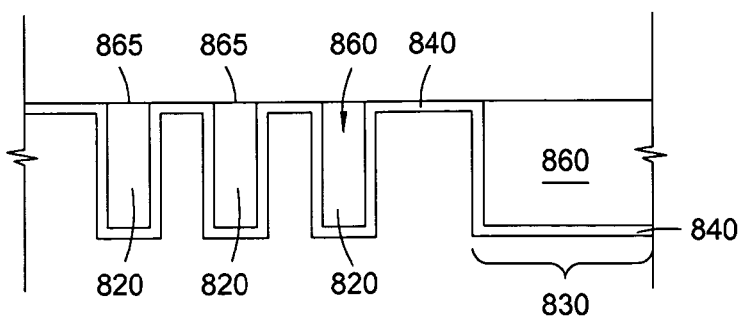
Figure 8D:
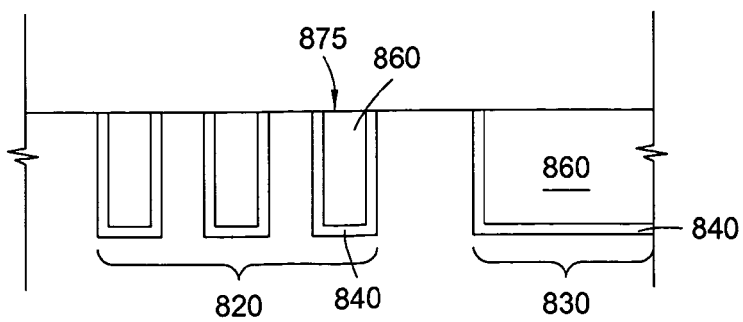

FIGS. 8A-8D are schematic cross-sectional views illustrating a polishing process performed on a substrate according to one embodiment for planarizing a substrate surface described herein. A first ECMP process may be used to remove bulk tungsten material from the substrate surface as shown from FIG. 8A and then a second ECMP process to remove residual tungsten materials as shown from FIGS. 8B-8C. Barrier material removal, and optionally, buffing, are used to remove the remaining barrier material and planarized the surface to form the damascene structure as shown in FIG. 8D. The first ECMP process produces to a fast removal rate of the tungsten layer and the second ECMP process, due to the precise removal of the remaining tungsten material, forms level substrate surfaces with reduced or minimal dishing and erosion of substrate features. The ECMP or CMP barrier removal process also forms level substrate surfaces with reduced or minimal dishing and erosion of substrate features.

FIG. 8A is a schematic cross-sectional view illustrating one embodiment of a first electrochemical mechanical polishing technique for removal of bulk tungsten material. The substrate is disposed in a receptacle, such as a basin or platen containing a first electrode. The substrate 800 has a dielectric layer 810 patterned with narrow feature definitions 820 and wide feature definitions 830. The feature definitions, such as vias, trenches, contacts, or holes, are patterned and etched into the dielectric layer 810 by conventional photolithographic and etching techniques. A barrier material, for example, titanium and/or titanium nitride, is deposited as a barrier layer 840 on feature definitions 820, 830 deposited therein. Sufficient conductive material 860, for example, tungsten, is deposited on the substrate surface to fill the feature definitions 820, 830. The deposition profile of the excess material includes a high overburden 870, also referred to as a hill or peak, formed over narrow feature definitions 820 and a minimal overburden 880, also referred to as a valley, over wide feature definitions 830.

A polishing composition 850 as described herein for bulk tungsten removal is provided to the substrate surface. The polishing composition may be provided at a flow rate between about 100 and about 400 milliliters per minute, such as about 300 milliliters per minute, to the substrate surface. An example of the polishing composition for the bulk removal step includes between about 1 vol % and about 5 vol % of sulfuric acid, between about 1 vol % and about 5 vol % of phosphoric acid, between about 1 wt % and about 5 wt % of ammonium citrate, between about 0.5 wt % and about 5 wt % of ethylenediamine, a pH adjusting agent to provide a pH between about 6 and about 10, and deionized water. A further example of a polishing composition includes about 2 vol % of sulfuric acid, about 2 vol % of phosphoric acid, about 2 wt % of ammonium citrate, about 2 wt % of ethylenediamine, potassium hydroxide to provide a pH between about 8.4 and about 8.9 and deionized water. The composition has a conductivity of between about 60 and about 64 milliSiemens (mS). The bulk polishing composition described herein having strong etchants such as sulfuric acid as well as a basic pH, in which tungsten is more soluble, allow for an increased removal rate compared to the residual tungsten polishing composition described herein.

A polishing article coupled to a polishing article assembly containing a second electrode is then physically contacted and/or electrically coupled with the substrate through a conductive polishing article. The substrate surface and polishing article are contacted at a pressure less than about 2 pounds per square inch (lb/in$^2$ or psi) (13.8 kPa). Removal of the conductive material 860 may be performed with a process having a pressure of about 1 psi (6.9 kPa) or less, for example, from about 0.01 psi (69 Pa) to about 1 psi (6.9 kPa), such as between about 0.1 (0.7 kPa) psi and about 0.8 psi (5.5 kPa) or between about 0.1 (0.7 kPa) psi and less than about 0.5 psi (3.4 kPa). In one aspect of the process, a pressure of about 0.3 psi (2.1 kPa) or less is used.

The polishing pressures used herein reduce or minimize damaging shear forces and frictional forces for substrates containing low k dielectric materials. Reduced or minimized forces can result in reduced or minimal deformations and defect formation of features from polishing. Further, the lower shear forces and frictional forces have been observed to reduce or minimize formation of topographical defects, such as erosion of dielectric materials and dishing of conductive materials as well as reducing delamination, during polishing. Contact between the substrate and a conductive polishing article also allows for electrical contact between the power source and the substrate by coupling the power source to the polishing article when contacting the substrate.

Relative motion is provided between the substrate surface and the conductive pad assembly 222. The conductive pad assembly 222 disposed on the platen is rotated at a platen rotational rate of between about 7 rpm and about 50 rpm, for example, about 28 rpm, and the substrate disposed in a carrier head is rotated at a carrier head rotational rate between about 7 rpm and about 70 rpm, for example, about 37 rpm. The respective rotational rates of the platen and carrier head are believed to provide reduced shear forces and frictional forces when contacting the polishing article and substrate. Both the carrier head rotational speed and the platen rotational speed may be between about 7 rpm and less than 40 rpm. In one aspect of the invention, the processes herein may be performed with carrier head rotational speed greater than a platen rotational speed by a ratio of carrier head rotational speed to platen rotational speed of greater than about 1:1, such as a ratio of carrier head rotational speed to platen rotational speed between about 1.5:1 and about 12:1, for example between about 1.5:1 and about 3:1, to remove the tungsten material.

A bias from a power source 224 is applied between the two electrodes. The bias may be transferred from a conductive pad and/or electrode in the polishing article assembly 222 to the substrate 208. The process may also be performed at a temperature between about 20° C. and about 60° C.

The bias is generally provided at a current density up to about 100 mA/cm$^2$ which correlates to an applied current of about 40 amps to process substrates with a diameter up to about 300 mm. For example, a 200 mm diameter substrate may have a current density from about 0.01 mA/cm$^2$ to about 50 mA/cm$^2$, which correlates to an applied current from about 0.01 A to about 20 A. The invention also contemplates that the bias may be applied and monitored by volts, amps and watts. For example, in one embodiment, the power supply may apply a power between about 0 watts and 100 watts, a voltage between about 0 V and about 10 V, and a current between about 0.01 amps and about 10 amps. In one example of power application a voltage of between about 2.5 volts and about 4.5, such as about 3 volts, volts is applied during application of the bulk polishing composition described herein to the substrate. The substrate is typically exposed to the polishing composition and power application for a period of time sufficient to remove the bulk of the overburden of tungsten disposed thereon.

The bias may be varied in power and application depending upon the user requirements in removing material from the substrate surface. For example, increasing power application has been observed to result in increasing anodic dissolution. The bias may also be applied by an electrical pulse modulation technique. Pulse modulation techniques may vary, but generally include a cycle of applying a constant current density or voltage for a first time period, then applying no current density or voltage or a constant reverse current density or voltage for a second time period. The process may then be repeated for one or more cycles, which may have varying power levels and durations. The power levels, the duration of power, an "on" cycle, and no power, an "off" cycle" application, and frequency of cycles, may be modified based on the removal rate, materials to be removed, and the extent of the polishing process. For example, increased power levels and increased duration of power being applied have been observed to increase anodic dissolution.

In one pulse modulation process for electrochemical mechanical polishing, the pulse modulation process comprises an on/off power technique with a period of power application, "on", followed by a period of no power application, "off". The on/off cycle may be repeated one or more times during the polishing process. The "on" periods allow for removal of exposed conductive material from the substrate surface and the "off" periods allow for polishing composition components and by-products of "on" periods, such as metal ions, to diffuse to the surface and complex with the conductive material. During a pulse modulation technique process it is believed that the metal ions migrate and interact with the corrosion inhibitors and/or chelating agents by attaching to the passivation layer in the non-mechanically disturbed areas. The process thus allows etching in the electrochemically active regions, not covered by the passivation layer, during an "on" application, and then allowing reformation of the passivation layer in some regions and removal of excess material during an "off" portion of the pulse modulation technique in other regions. Thus, control of the pulse modulation technique can control the removal rate and amount of material removed from the substrate surface.

The "on"/"off" period of time may be between about 1 second and about 60 seconds each, for example, between about 2 seconds and about 25 seconds, and the invention contemplates the use of pulse techniques having "on" and "off" periods of time greater and shorter than the described time periods herein. In one example of a pulse modulation technique, anodic dissolution power is applied between about 16% and about 66% of each cycle.

Non-limiting examples of pulse modulation technique with an on/off cycle for electrochemical mechanical polishing of materials described herein include: applying power, "on", between about 5 seconds and about 10 seconds and then not applying power, "off", between about 2 seconds and about 25 seconds; applying power for about 10 seconds and not applying power for 5 seconds, or applying power for 10 seconds and not applying power for 2 seconds, or even applying power for 5 seconds and not applying power for 25 seconds to provide the desired polishing results. The cycles may be repeated as often as desired for each selected process. One example of a pulse modulation process is described in commonly assigned U.S. Pat. No. 6,379,223, which is incorporated by reference herein to the extent not inconsistent with the claimed aspects and disclosure herein. Further examples of a pulse modulation process is described in co-pending U.S. Provisional patent application Ser. No. 10/611,805, entitled "Effective Method To Improve Surface Finish In Electrochemically Assisted Chemical Mechanical Polishing," filed on Jun. 30, 2003, which is incorporated by reference herein to the extent not inconsistent with the claimed aspects and disclosure herein.

A removal rate of conductive material of up to about 15,000 Å/min can be achieved by the processes described herein. Higher removal rates are generally desirable, but due to the goal of maximizing process uniformity and other process variables (e.g., reaction kinetics at the anode and cathode) it is common for dissolution rates to be controlled from about 100 Å/min to about 15,000 Å/min. In one embodiment of the invention where the bulk tungsten material to be removed is less than 5,000 Å thick, the voltage (or current) may be applied to provide a removal rate from about 100 Å/min to about 5,000 Å/min, such as between about 2,000 Å/min to about 5,000 Å/min. The residual material is removed at a rate lower than the bulk removal rate and by the processes described herein may be removed at a rate between about 400 Å/min to about 1,500 Å/min.

Figure 1A:
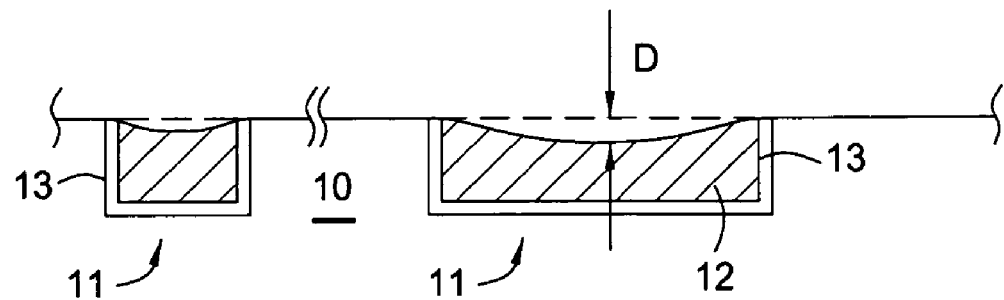
FIGS. 1A and 1B schematically illustrate the phenomenon of dishing and erosion respectively.
Figure 1B:
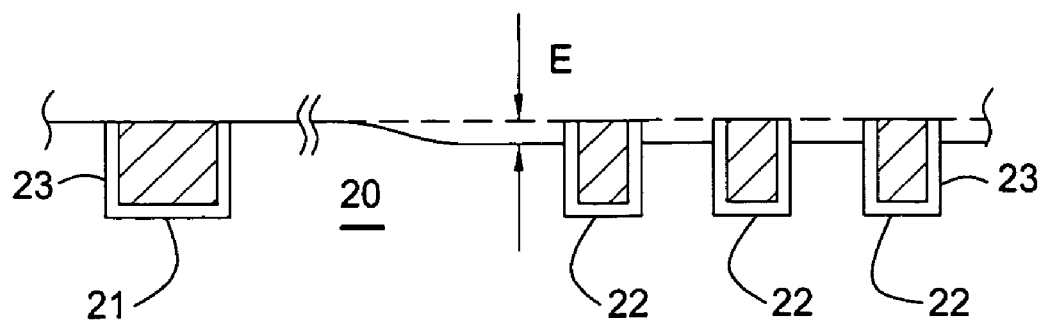

The second ECMP process is slower in order to prevent excess metal removal from forming topographical defects, such as concavities or depressions known as dishing D, as shown in FIG. 1A, and erosion E as shown in FIG. 1B. Therefore, a majority of the conductive layer 860 is removed at a faster rate during the first ECMP process than the remaining or residual conductive layer 860 during the second ECMP process. The two-step ECMP process increases throughput of the total substrate processing and while producing a smooth surface with little or no defects.

FIG. 8B illustrates the second ECMP polishing step after at least about 50% of the conductive material 860 was removed after the bulk removal of the first ECMP process, for example, about 90%. After the first ECMP process, conductive material 860 may still include the high overburden 870, peaks, and/or minimal overburden 880, valleys, but with a reduced proportionally size. However, conductive material 860 may also be rather planar across the substrate surface (not pictured).

A second polishing composition as described herein for residual conductive material removal is provided to the substrate surface. The residual polishing composition may be provided at a flow rate between about 100 and about 400 milliliters per minute, such as about 300 milliliters per minute. An example of the polishing composition for the residual removal step includes between about 0.2 vol % and about 5 vol % of sulfuric acid, between about 0.2 vol % and about 5 vol % of phosphoric acid, between about 0.1 wt % and about 5 wt % of ammonium citrate, a pH adjusting agent to provide a pH between about 3 and about 8, and deionized water, such as a polishing composition including about 1 vol % of sulfuric acid, about 1.5 vol % of phosphoric acid, about 0.5 wt % of ammonium citrate, potassium hydroxide to provide a pH between about 5 and about 7, such as between about 5.6 and 6.8, and deionized water. The example residual polishing composition has a conductivity of about 49 milliSiemens (mS).

The residual polishing composition described herein is believed to form a polytungstate layer 890 on the surface of the exposed tungsten material. The polytungstate layer is formed by the chemical interaction between the ammonium citrate and phosphoric acid and the exposed tungsten material. The polytungstate layer is a more stable material than the tungsten material and is removed at a lower rate than the tungsten material. The polytungstate layer may also chemically and/or electrically insulate material disposed on a substrate surface. It is further believed that increasing the acidic pH of the polishing composition enhances the formation of polytungstate material on the substrate surface. A more acidic residual polishing composition is used as compared to the more basic bulk removal composition. A polytungstate layer may also be formed under the process conditions and the polishing compositions described for the bulk polishing process.

The thickness and density of the polytungstate layer can dictate the extent of chemical reactions and/or amount of anodic dissolution. For example, a thicker or denser polytungstate layer has been observed to result in less anodic dissolution compared to thinner and less dense passivation layers. Thus, control of the composition of pH of the composition, phosphoric acid, and/or chelating agents, allow control of the removal rate and amount of material removed from the substrate surface. The resulting reduced removal rate as compared to the bulk polishing composition reduces or minimizes formation of topographical defects, such as erosion of dielectric materials and dishing of conductive materials. A reduced down force pressure from conventional polishing pressures of 2 psi or more also result in reduced delamination during polishing.

The mechanical abrasion in the above residual removal process are performed at a contact pressure less than about 2 pounds per square inch ($lb/in^2$ or psi) (13.8 kPa) between the polishing pad and the substrate. Removal of the conductive material 860 may be performed with a process having a pressure of about 1 psi (6.9 kPa) or less, for example, from about 0.01 psi (69 Pa) to about 1 psi (6.9 kPa), such as between about 0.1 (0.7 kPa) psi and about 0.8 psi (5.5 kPa). In one aspect of the process, a pressure of about 0.3 psi (2.1 kPa) or less is used. Contact between the substrate and a conductive polishing article also allows for electrical contact between the power source and the substrate by coupling the power source to the polishing article when contacting the substrate.

Relative motion is provided between the substrate surface and the conductive pad assembly 222. The conductive pad assembly 222 disposed on the platen is rotated at a rotational rate of between about 7 rpm and about 50 rpm, for example, about 28 rpm, and the substrate disposed in a carrier head is rotated at a rotational rate between about 7 rpm and about 70 rpm, for example, about 37 rpm. The respective rotational rates of the platen and carrier head are believed to provide reduce shear forces and frictional forces when contacting the polishing article and substrate.

Mechanical abrasion by a conductive polishing article removes the polytungstate layer 890 that insulates or suppresses the current for anodic dissolution, such that areas of high overburden are preferentially removed over areas of minimal overburden as the polytungstate layer 890 is retained in areas of minimal or no contact with the conductive pad assembly 222. The removal rate of the conductive material 860 covered by the polytungstate layer 890 is less than the removal rate of conductive material without the polytungstate layer 890. As such, the excess material disposed over narrow feature definitions 820 and the substrate field 850 is removed at a higher rate than over wide feature definitions 830 still covered by the polytungstate layer 890.

A bias from a power source 224 is applied between the two electrodes. The bias may be transferred from a conductive pad and/or electrode in the polishing article assembly 222 to the substrate 208. The bias is as applied above for the bulk polishing process, and typically uses a power level less than or equal to the power level of the bulk polishing process. For example, for the residual removal process, the power application is of a voltage of between about 1.8 volts and about 2.5, such as 2 volts. The substrate is typically exposed to the polishing composition and power application for a period of time sufficient to remove at least a portion or all of the desired material disposed thereon. The process may also be performed at a temperature between about 20° C. and about 60° C.

Referring to FIG. 8C, most, if not all of the conductive layer 860 is removed to expose barrier layer 840 and conductive trenches 865 by polishing the substrate with a second, residual, ECMP process including the second ECMP polishing composition described herein. The conductive trenches 865 are formed by the remaining conductive material 860. The barrier material may then be selectively polished by a third polishing step to provide a planarized substrate surface containing conductive trenches 875, as depicted in FIG. 8D. The barrier polishing composition provides for selective removal of barrier material to tungsten and oxide at a barrier removal rate to tungsten removal rate at between about 30:1 and about 80:1, such as about 60:1, and a barrier removal rate to dielectric removal rate of between about 3:1 and about 6:1, such as about 4:1.

The barrier polishing process may be a chemical mechanical polishing process or an electro chemical mechanical polishing process, or a multi-step process of both.

The barrier removal process using chemical mechanical polishing (CMP) includes providing a CMP composition at a flow rate between about 100 and about 500 milliliters per minute, such as between about 200 milliliters and about 300 milliliters per minute, for example, about 150 milliliters to the substrate surface. An example of the CMP composition for the barrier removal step includes between about 1 wt. % and about 10 wt. % of an oxidizer, between about 0.5 wt. % and about 5 wt. % of a chelating agent, between about 0.0001 wt % and about 1 wt % of a polymeric stabilizer, between about 0.3 wt % and about 10 wt % of abrasive particles, a pH between about 1 and about 6, and a solvent. A further example of a polishing composition includes about 3 wt. % of hydrogen peroxide, about 1 wt. % of ammonium citrate, about 0.1 wt. % of polyacrylic acid, about 4 wt % of alumina particles, a pH between about 4 and about 5, and a solvent.

Alternatively, the barrier removal composition may be used in a electrochemical mechanical polishing (ECMP) process as described for tungsten removal herein with the power application being within the within the range of power application in the tungsten electrochemical mechanical polishing process. The barrier removal process using electrochemical mechanical polishing includes providing an ECMP barrier composition at a flow rate between about 10 and about 500 milliliters per minute with the ECMP barrier composition including about 2% by volume phosphoric acid, about 2% by weight ammonium citrate, about 0.3% by weight benzotriazole, about 0.01% by weight $(NH_4)_2SiF_6$, between about 1% and about 3% by volume of potassium hydroxide to provide a pH of about 3 and deionized water.

A polishing article is then physically contacted and/or electrically coupled with the substrate through a polishing article. The substrate surface and polishing article are contacted at a pressure of between about 0.5 psi (3.4 kPa) and about 5 psi (34 kPa), such as about 2 pounds per square inch ($lb/in^2$ or psi) (13.8 kPa). Relative motion is provided between the substrate surface and the conductive pad assembly 222. The conductive pad assembly 222 disposed on the platen is rotated at a platen rotational rate of between about 50 rpm and about 100 rpm, for example, about 80 rpm, and the substrate disposed in a carrier head is rotated at a carrier head rotational rate between about 10 rpm and about 200 rpm, for example, about 80 rpm. Alternatively, for the electrochemical mechanical polishing process, a conductive polishing article coupled to an second electrode is contacted with the substrate and a power application between about 0.01 milliamps/$cm^2$ and about 20 milliamps/$cm^2$ is applied between the substrate and the electrode.

After conductive material and barrier material removal processing steps, the substrate may then be buffed to minimize surface defects. Buffing may be performed with a soft polishing article, i.e., a hardness of about 40 or less on the Shore D hardness scale as described and measured by the American Society for Testing and Materials (ASTM), headquartered in Philadelphia, Pa., at reduced polishing pressures, such as about 2 psi or less.

Optionally, a cleaning composition may be applied to the substrate after each of the polishing processes to remove particulate matter and spent reagents from the polishing process as well as help minimize metal residue deposition on the polishing articles and defects formed on a substrate surface. An example of a suitable cleaning composition is ELECTRA CLEAN™, commercially available from Applied Materials, Inc., of Santa Clara, Calif.

Finally, the substrate may be exposed to a post polishing cleaning process to reduce defects formed during polishing or substrate handling. Such processes can minimize undesired oxidation or other defects in copper features formed on a substrate surface. An example of such a post polishing cleaning is the application of ELECTRA CLEAN™, commercially available from Applied Materials, Inc., of Santa Clara, Calif.

It has been observed that substrate planarized by the processes described herein have exhibited reduced topographical defects, such as dishing and erosion, reduced residues, improved planarity, and improved substrate finish.

Tungsten Polishing Compositions

Generally, the tungsten polishing composition includes one or more acid based electrolyte systems, a first chelating agent including an organic salt, a pH adjusting agent to provide a pH between about 2 and about 10 and a solvent. The polishing composition may further include a second chelating agent having one or more functional groups selected from the group consisting of amine groups, amide groups, and combinations thereof. The one or more acid based electrolyte systems preferably include two acid based electrolyte systems, for example, a sulfuric acid based electrolyte system and a phosphoric acid based electrolyte system. Embodiments of the polishing composition may be used for polishing bulk and/or residual materials. The polishing composition may optionally include one or more corrosion inhibitors or a polishing enhancing material, such as abrasive particles. While the compositions described herein are oxidizer free compositions, the invention contemplates the use of oxidizers as a polishing enhancing material that may further be used with an abrasive material. It is believed that the polishing compositions described herein improve the effective removal rate of materials, such as tungsten, from the substrate surface during ECMP, with a reduction in planarization type defects and yielding a smoother substrate surface. The embodiments of the compositions may be used in a one-step or two-step polishing process.

Although the polishing compositions are particularly useful for removing tungsten, it is believed that the polishing compositions may also remove other conductive materials, such as aluminum, platinum, copper, titanium, titanium nitride, tantalum, tantalum nitride, cobalt, gold, silver, ruthenium and combinations thereof. Mechanical abrasion, such as from contact with the conductive pad 203 and/or abrasives, and/or anodic dissolution from an applied electrical bias, may be used to improve planarity and improve removal rate of these conductive materials.

The sulfuric acid based electrolyte system includes, for example, electrolytes and compounds having a sulfate group ($SO_4^{2-}$), such as sulfuric acid ($H_2SO_4$), and/or derivative salts thereof including, for example, ammonium hydrogen sulfate ($NH_4HSO_4$), ammonium sulfate, potassium sulfate, tungsten sulfate, or combinations thereof, of which sulfuric acid is preferred. Derivative salts may include ammonium ($NH_4^+$), sodium ($Na^+$), tetramethyl ammonium ($Me_4N^+$, potassium ($K^+$) salts, or combinations thereof, among others.

The phosphoric acid based electrolyte system includes, for example, electrolytes and compounds having a phosphate group ($PO_4^{3-}$), such as, phosphoric acid, and/or derivative salts thereof including, for example, phosphate ($M_xH_{(3-x)}PO_4$) (x=1, 2, 3), with M including ammonium ($NH_4^+$), sodium ($Na^+$), tetramethyl ammonium ($Me_4N^+$) or potassium ($K^+$) salts, tungsten phosphate, ammonium dihydrogen phosphate (($NH_4$)$H_2PO_4$), diammonium hydrogen phosphate (($NH_4$)$_2HPO_4$), and combinations thereof, of which phosphoric acid is preferred. Alternatively, an acetic acid based electrolytic, including acetic acid and/or derivative salts, or a salicylic acid based electrolyte, including salicylic acid and/or derivative salts, may be used in place of the phosphoric acid based electrolyte system. The acid based electrolyte systems described herein may also buffer the composition to maintain a desired pH level for processing a substrate. The invention also contemplates that conventional electrolytes known and unknown may also be used in forming the composition described herein using the processes described herein.

The sulfuric acid based electrolyte system and phosphoric acid based electrolyte system may respectively, include between about 0.1 and about 30 percent by weight (wt %) or volume (vol %) of the total composition of composition to provide suitable conductivity for practicing the processes described herein. Acid electrolyte concentrations between about 0.2 vol % and about 5 vol %, such as about 0.5 vol % and about 3 vol %, for example, between about 1 vol % and about 3 vol %, may be used in the composition. The respective acid electrolyte compositions may also vary between polishing compositions. For example in a first composition, the acid electrolyte may comprises between about 1.5 vol % and about 3 vol % sulfuric acid and between about 2 vol % and about 3 vol % phosphoric acid for bulk metal removal and in a second composition, between about 1 vol % and about 2 vol % vol % sulfuric acid and between about 1.5 vol % and about 2 vol % phosphoric acid for residual metal removal. The invention contemplates embodiments of the composition including a second composition having a sulfuric acid and/or phosphoric acid concentration less than the first composition.

One aspect or component of the present invention is the use of one or more chelating agents to complex with the surface of the substrate to enhance the electrochemical dissolution process. In any of the embodiments described herein, the chelating agents can bind to ions of a conductive material, such as tungsten ions, increase the removal rate of metal materials and/or improve polishing performance. The chelating agents may also be used to buffer the polishing composition to maintain a desired pH level for processing a substrate.

One suitable category of chelating agents includes inorganic or organic acid salts. Salts of other organic acids which may be suitable are salts of compounds having one or more functional groups selected from the group of carboxylate groups, dicarboxylate groups, tricarboxylate groups, a mixture of hydroxyl and carboxylate groups, and combinations thereof. The metal materials for removal, such as tungsten, may be in any oxidation state before, during or after ligating with a functional group. The functional groups can bind the metal materials created on the substrate surface during processing and remove the metal materials from the substrate surface.

Examples of suitable inorganic or organic acid salts include ammonium and potassium salts of organic acids, such as ammonium oxalate, ammonium citrate, ammonium succinate, monobasic potassium citrate, dibasic potassium citrate, tribasic potassium citrate, potassium tartarate, ammonium tartarate, potassium succinate, potassium oxalate, and combinations thereof. Examples of suitable acids for use in forming the salts of the chelating agent that having one or more carboxylate groups include citric acid, tartaric acid, succinic acid, oxalic acid, acetic acid, adipic acid, butyric acid, capric acid, caproic acid, caprylic acid, glutaric acid, glycolic acid, formaic acid, fumaric acid, lactic acid, lauric acid, malic acid, maleic acid, malonic acid, myristic acid, plamitic acid, phthalic acid, propionic acid, pyruvic acid, stearic acid, valeric acid, and combinations thereof.

The polishing composition may include one or more inorganic or organic salts at a concentration between about 0.1% and about 15% by volume or weight of the composition, for example, between about 0.2% and about 5% by volume or weight, such as between about 1% and about 3% by volume or weight. For example, between about 0.5% and about 2% by weight of ammonium citrate may be used in the polishing composition.

Alternatively, a second chelating agent having one or more functional groups selected from the group of amine groups, amide groups, hydroxyl groups, and combinations thereof, may be used in the composition. Preferred functional groups are selected from the group consisting of amine groups, amide groups, hydroxyl groups, and combinations thereof, do not have acidic functional groups such as carboxylate groups, dicarboxylate groups, tricarboxylate groups, and combinations thereof. The polishing composition may include one or more chelating agents having one or more functional groups selected from the group of amine groups, amide groups, hydroxyl groups, and combinations thereof, at a concentration between about 0.1% and about 5% by volume or weight, but preferably utilized between about 1% and about 3% by volume or weight, for example about 2% by volume or weight. For example, between about 2 vol % and about 3 vol % of ethylenediamine may be used as a chelating agent. Further examples of suitable chelating agents include compounds having one or more amine and amide functional groups, such as ethylenediamine, and derivatives thereof including diethylenetriamine, hexadiamine, amino acids, ethylenediaminetetraacetic acid, methylformamide, or combinations thereof.

The composition may include one or more pH adjusting agents to achieve a pH between about 2 and about 10. The amount of pH adjusting agent can vary as the concentration of the other components is varied in different formulations, but in general the total composition may include up to about 70 wt % of the one or more pH adjusting agents, but preferably between about 0.2 wt % and about 25 wt. %. Different compounds may provide different pH levels for a given concentration, for example, the composition may include between about 0.1 wt % and about 10 wt % of a base, such as potassium hydroxide, sodium hydroxide, ammonium hydroxide, tetramethyl ammonium hydroxide (TMAH), or combinations thereof, to provide the desired pH level. The one or more pH adjusting agents can be chosen from a class of organic acids, for example, carboxylic acids, such as acetic acid, citric acid, oxalic acid, phosphate-containing components including phosphoric acid, ammonium phosphates, potassium phosphates, and combinations thereof, or a combination thereof. Inorganic acids including hydrochloric acid, sulfuric acid, and phosphoric acid may also be used in the polishing composition.

Typically, the amount of pH adjusting agents in the polishing composition will vary depending on the desired pH range for components having different constituents for various polishing processes. For example, in a bulk tungsten polishing process, the amount of pH adjusting agents may be adjusted to produce pH levels between about 6 and about 10. The pH in one embodiment of the bulk tungsten removal composition is a neutral or basic pH in the range between about 7 and about 9, for example, a basic composition greater than 7 and less than or equal to about 9, such as between about 8 and about 9.

In a further example for a residual tungsten polishing process, the amount of pH adjusting agents may be adjusted to produce pH levels between about 2 and about 8. The pH in one embodiment of the residual tungsten removal composition is a neutral or acidic pH in the range between about 5 and less than about 7, for example, between about 5.6 and about 6.8.

The compositions included herein may include between about 1 vol % and about 5 vol % of sulfuric acid, between about 1 vol % and about 5 vol % of phosphoric acid, between about 1 wt % and about 5 wt % of ammonium citrate, between about 0.5 wt % and about 5 wt % of ethylenediamine, a pH adjusting agent to provide a pH between about 6 and about 10, and deionized water, such as a composition including between about 1 vol % and about 3 vol % of sulfuric acid, between about 1 vol % and about 3 vol % of phosphoric acid, between about 1 wt % and about 3 wt % of ammonium citrate, between about 1 wt % and about 3 wt % of ethylenediamine, potassium hydroxide to provide a pH between about 7 and about 9, and deionized water. Another embodiments of the composition may include between about 0.2 vol % and about 5 vol % of sulfuric acid, between about 0.2 vol % and about 5 vol % of phosphoric acid, between about 0.1 wt % and about 5 wt % of ammonium citrate, a pH adjusting agent to provide a pH between about 2 and about 8, such as between about 3 and about 8, and deionized water. Another embodiment of the composition may include between about 0.5 vol % and about 2 vol % of sulfuric acid, between about 0.5 vol % and about 2 vol % of phosphoric acid, between about 0.5 wt % and about 2 wt % of ammonium citrate, potassium hydroxide to provide a pH between about 6 and about 7, and deionized water.

In any of the embodiments described herein, the preferred polishing compositions described herein are oxidizer-free compositions, for example, compositions free of oxidizers and oxidizing agents. Examples of oxidizers and oxidizing agents include, without limitation, hydrogen peroxide, ammonium persulfate, potassium iodate, potassium permanganate, and cerium compounds including ceric nitrate, ceric ammonium nitrate, bromates, chlorates, chromates, iodic acid, among others.

Alternatively, the polishing compositions may include an oxidizing compound. Examples of suitable oxidizer compounds beyond those listed herein are nitrate compounds including ferric nitrate, nitric acid, and potassium nitrate. In one alternative embodiment of the compositions described herein, a nitric acid based electrolyte system, such as electrolytes and compounds having a nitrate group ($NO_3^{1-}$), such as nitric acid ($HNO_3$), and/or derivative salts thereof, including ferric nitrate ($Fe(NO_3)_3$), may be used in place of the sulfuric acid based electrolyte.

In any of the embodiments described herein, etching inhibitors, for example, corrosion inhibitors, can be added to reduce the oxidation or corrosion of metal surfaces, by chemical or electrical means, by forming a layer of material which minimizes the chemical interaction between the substrate surface and the surrounding electrolyte. The layer of material formed by the inhibitors may suppress or minimize the electrochemical current from the substrate surface to limit electrochemical deposition and/or dissolution.

Etching inhibitors of tungsten inhibits the conversion of solid tungsten into soluble tungsten compounds while at the same time allowing the composition to convert tungsten to a soft oxidized film that can be evenly removed by abrasion. Useful etching inhibitors for tungsten include compounds having nitrogen containing functional groups such as nitrogen containing heterocycles, alkyl ammonium ions, amino alkyls, amino acids. Etching inhibitors include corrosion inhibitors, such as compounds including nitrogen containing heterocycle functional groups, for example, 2,3,5-trimethylpyrazine, 2-ethyl-3,5-dimethylpyrazine, quinoxaline, acetyl pyrrole, pyridazine, histidine, pyrazine, benzimidazole and mixtures thereof.

The term "alkyl ammonium ion" as used herein refers to nitrogen containing compounds having functional groups that can produce alkyl ammonium ions in aqueous compositions. The level of alkylammonium ions produced in aqueous compositions including compounds with nitrogen containing functional groups is a function of composition pH and the compound or compounds chosen. Examples of nitrogen containing functional group corrosion inhibitors that produce inhibitory amounts of alkyl ammonium ion functional groups at aqueous composition with a pH less than 9.0 include isostearylethylimididonium, cetyltrimethyl ammonium hydroxide, alkaterge E (2-heptadecenyl-4-ethyl-2 oxazoline 4-methanol), aliquat 336 (tricaprylmethyl ammonium chloride), nuospet 101 (4,4 dimethyloxazolidine), tetrabutylammonium hydroxide, dodecylamine, tetramethylammonium hydroxide, derivatives thereof, and mixtures thereof.

Useful amino alkyl corrosion inhibitors include, for example, aminopropylsilanol, aminopropylsiloxane, dodecylamine, mixtures thereof, and synthetic and naturally occurring amino acids including, for example, lysine, tyrosine, glutamine, glutamic acid, glycine, cystine and glycine.

A preferred alkyl ammonium ion functional group containing inhibitor of tungsten etching is SILQUEST A-1106 silane, manufactured by OSI Specialties, Inc. SILQUEST A-1106 is a mixture of approximately 60 weight percent (wt %) water, approximately 30 wt % aminopropylsiloxane, and approximately 10 wt % aminopropylsilanol. The aminopropylsiloxane and aminopropylsilanol each form an inhibiting amount of corresponding alkylammonium ions at a pH less than about 7. A most preferred amino alkyl corrosion inhibitor is glycine (aminoacetic acid).

Examples of suitable inhibitors of tungsten etching include halogen derivatives of alkyl ammonium ions, such as dodecyltrimethylammonium bromide, imines, such as polyethyleneimine, carboxy acid derivatives, such as calcium acetate, organosilicon compounds, such as di(mercaptopropyl) dimethoxylsilane, and polyacrylates, such as polymethylacrylate.

The inhibitor of tungsten etching should be present in the composition of this invention in amounts ranging from about 0.001 wt % to about 2.0 wt % and preferably from about 0.005 wt % to about 1.0 wt %, and most preferably from about 0.01 wt % to about 0.10 wt %.

The inhibitors of tungsten etching are effective at composition with a pH up to about 9.0. It is preferred that the compositions of this invention have a pH of less than about 7.0 and most preferably less than about 6.5.

Other inhibitors may include between about 0.001% and about 5.0% by weight of the organic compound from one or more azole groups. The commonly preferred range being between about 0.2% and about 0.4% by weight. Examples of organic compounds having azole groups include benzotriazole, mercaptobenzotriazole, 5-methyl-1-benzotriazole, and combinations thereof. Other suitable corrosion inhibitors include film forming agents that are cyclic compounds, for example, imidazole, benzimidazole, triazole, and combinations thereof. Derivatives of benzotriazole, imidazole, benzimidazole, triazole, with hydroxy, amino, imino, carboxy, mercapto, nitro and alkyl substituted groups may also be used as corrosion inhibitors. Other corrosion inhibitors include urea and thiourea among others.

Alternatively, polymeric inhibitors, for non-limiting examples, polyalkylaryl ether phosphate or ammonium nonylphenol ethoxylate sulfate, may be used in replacement or conjunction with azole containing inhibitors in an amount between about 0.002% and about 1.0% by volume or weight of the composition.

While the polishing compositions described above are free of oxidizers (oxidizer-free) and/or abrasive particles (abrasive-free), the polishing composition contemplates including one or more surface finish enhancing and/or removal rate enhancing materials including abrasive particles, one or more oxidizers, and combinations thereof. One or more surfactants may be used in the polishing composition to increase the dissolution or solubility of materials, such as metals and metal ions or by-products produced during processing, reduce any potential agglomeration of abrasive particles in the polishing composition, improve chemical stability, and reduce decomposition of components of the polishing composition. Suitable oxidizers and abrasives are described in co-pending U.S. patent application Ser. No. 10/378,097, filed on Feb. 26, 2004, which is incorporated by reference herein to the extent not inconsistent with the claimed aspects and disclosure herein.

Alternatively, the polishing composition may further include electrolyte additives including suppressors, enhancers, levelers, brighteners, stabilizers, and stripping agents to improve the effectiveness of the polishing composition in polishing of the substrate surface. For example, certain additives may decrease the ionization rate of the metal atoms, thereby inhibiting the dissolution process, whereas other additives may provide a finished, shiny substrate surface. The additives may be present in the polishing composition in concentrations up to about 15% by weight or volume, and may vary based upon the desired result after polishing.

Further examples of additives to the polishing composition are more fully described in U.S. patent application Ser. No. 10/141,459, filed on May 7, 2002, which is incorporated by reference herein to the extent not inconsistent with the claimed aspects and disclosure herein.

The balance or remainder of the polishing compositions described above is a solvent, such as a polar solvent, including water, preferably deionized water. Other solvents may include, for example, organic solvents, such as alcohols or glycols, and in some embodiments may be combined with water. The amount of solvent may be used to control the concentrations of the various components in the composition. For example, the electrolyte may be concentrated up to three times as concentrated as described herein and then diluted with the solvent prior to use of diluted at the processing station as described herein.

Generally, ECMP compositions are much more conductive than traditional CMP compositions. The ECMP compositions have a conductivity of about 10 milliSiemens (mS) or higher, while traditional CMP compositions have a conductivity from about 3 mS to about 5 mS. The conductivity of the ECMP compositions greatly influences the rate at which the ECMP process advances, i.e., more conductive compositions have a faster material removal rate. For removing bulk material, the ECMP composition has a conductivity of about 10 mS or higher, preferably in a range between about 40 mS and about 80 mS, for example, between about 50 mS and about 70 mS, such as between about 60 and about 64 mS. For residual material, the ECMP composition has a conductivity of about 10 mS or higher, preferably in a range between about 30 mS and about 60 mS, for example, between about 40 mS and about 55 mS, such as about 49 mS.

It has been observed that a substrate processed with the polishing composition described herein has improved surface finish, including less surface defects, such as dishing, erosion (removal of dielectric material surrounding metal features), and scratches, as well as improved planarity. The compositions described herein may be further disclosed by the examples as follows.

Chemical Mechanical Polishing Composition for Barrier Removal

Generally, the barrier chemical mechanical polishing composition includes an oxidizer, a chelating agent, a polymeric stabilizer, abrasive particles, a pH between about 1 and about 6, and a solvent. It is believed that the barrier CMP composition described herein improve the effective removal rate of barrier materials, such as titanium and/or titanium nitride, from the substrate surface during chemical mechanical polishing, with a reduction in planarization type defects and yielding a smoother substrate surface. The barrier CMP composition provides for selective removal of barrier material to tungsten and oxide at a barrier removal rate to tungsten removal rate at between about 30:1 and about 80:1, such as about 60:1, and a barrier removal rate to dielectric removal rate of between about 3:1 and about 6:1, such as about 4:1. Although the barrier CMP composition is particularly useful for removing titanium based materials, it is believed that the barrier polishing compositions may also remove other barrier materials including tantalum and tantalum derivative materials, such as tantalum nitride, and ruthenium, among other barrier materials.

The oxidizer includes, without limitation, hydrogen peroxide, ammonium persulfate, potassium iodate, potassium permnanganate, and cerium compounds including ceric nitrate, ceric ammonium nitrate, bromates, chlorates, chromates, iodic acid, among others. Alternatively, the barrier CMP composition may include an oxidizing compound. Examples of suitable oxidizer compounds beyond those listed herein are nitrate compounds including ferric nitrate, nitric acid, and potassium nitrate. The oxidizer may be present in an amount between about 1 wt % and about 10 wt. %, such as between about 1 wt % and about 5 wt. %, for example about 3 wt. %.

One aspect or component of the present invention is the use of one or more chelating agents to complex with the surface of the substrate to enhance the barrier removal process. The chelating agents may also be used to buffer the barrier CMP composition to maintain a desired pH level for processing a substrate.

One suitable category of chelating agents includes compounds having functional groups of amine groups, amide groups, hydroxyl groups, carboxylate groups, which may include dicarboxylate groups, tricarboxylate groups, and combinations thereof. Salts of the compounds having functional groups may also be used as the chelating agent. Examples of compounds having functional groups described here include glycine, ethylenediamine, ethylenediamine tetraacetic acid (EDTA), and combinations thereof. Examples of suitable inorganic or organic acid salts include ammonium and potassium salts of organic acids, such as ammonium oxalate, ammonium citrate, ammonium succinate, monobasic potassium citrate, dibasic potassium citrate, tribasic potassium citrate, potassium tartarate, ammonium tartarate, potassium succinate, potassium oxalate, and combinations thereof. The barrier CMP composition may include compounds having functional groups described herein at a concentration between about 0.5% and about 5% by volume or weight of the barrier CMP composition, for example, between about 0.5% and about 2% by volume or weight, such as about 1 wt. %.

The polymeric stabilizer may include surfactants and polymers that prevent flocculation and aggregation of the abrasives in the composition, and may include cationic, anionic, or nonanionic polymers and surfactants. Suitable polymeric compounds include polyethylene derivatives, such as polyethylene glycol and polyethylene oxide, and polyacrylic acid derivatives, such as polyacrylic acid. The polymeric stabilizer may be present in an amount between about 0.0001 wt % and about 1 wt. %, such as between about 0.01 wt % and about 1 wt. %, for example about 0.1 wt. %.

Abrasives particles may be used to improve the surface finish and removal rate of barrier materials from the substrate surface during polishing. The addition of abrasive particles to the barrier CMP composition can allow the final polished surface to achieve a surface roughness of that comparable with a conventional CMP process even at low pad pressures. Surface finish, or surface roughness, has been shown to have an effect on device yield and post polishing surface defects. Abrasive particles may comprise up to about 10 wt % of the barrier CMP composition during processing. A concentration between about 0.3 wt % and about 10 wt %, for example about 4 wt. % of abrasive particles may be used in the barrier CMP composition.

Suitable abrasives particles include inorganic abrasives, polymeric abrasives, and combinations thereof. Inorganic abrasive particles that may be used in the electrolyte include, but are not limited to, silica, alumina, zirconium oxide, titanium oxide, cerium oxide, germania, or any other abrasives of metal oxides, known or unknown. The typical abrasive particle size used in one embodiment of the current invention is generally from about 1 nm to about 1,000 nm, such as between about 30 nm and about 500 nm, for example, between about 30 nm and about 200 nm. Generally, suitable inorganic abrasives have a Mohs hardness of greater than 6, although the invention contemplates the use of abrasives having a lower Mohs hardness value. The polymer abrasives described herein may also be referred to as "organic polymer particle abrasives", "organic abrasives" or "organic particles." The polymeric abrasives may comprise abrasive polymeric materials. Examples of polymeric abrasives materials include polymethylmethacrylate, polymethyl acrylate, polystyrene, polymethacrylonitrile, and combinations thereof. The polymeric abrasives may be modified to have functional groups, e.g., one or more functional groups, that have an affinity for, i.e., can bind to, the conductive material or conductive material ions at the surface of the substrate, thereby facilitating the removal of material from the surface of a substrate.

The composition may have an acidic pH between about 1 and about 6, such as between about 3 and about 6, for example between about 4 and about 5.

The balance or remainder of the barrier CMP composition described above is a solvent, such as a polar solvent, including water, preferably deionized water. Other solvents may include, for example, organic solvents, such as alcohols or glycols, and in some embodiments may be combined with water. The amount of solvent may be used to control the concentrations of the various components in the barrier CMP composition. For example, the electrolyte may be concentrated up to three times as concentrated as described herein and then diluted with the solvent prior to use of diluted at the processing station as described herein.

Electrochemical Mechanical Polishing Composition for Barrier Removal

In one aspect, polishing compositions that can selectively polish a barrier material, such as titanium and titanium nitride, to a conductive fill material, such as tungsten or copper, are used for electrochemical mechanical polishing (ECMP) of the substrate surface. Generally, the barrier ECMP composition comprises an acid based electrolyte system, one or more etching agents, one or more etching inhibitors, one or more activating agents, and may optionally include one or more pH adjusting agents to provide a pH between about 2 and about 10, and a solvent. It is believed that the barrier ECMP composition described herein improve the effective removal rate of barrier materials from the substrate surface, during ECMP, with a reduction in planarization type defects.

Although the polishing barrier ECMP composition are particularly useful for removing titanium and titanium nitride, it is believed that the polishing barrier ECMP composition also may be used for the removal of other barrier materials including, for example, tantalum, tantalum nitride, ruthenium and combinations thereof. Mechanical abrasion, such as from contact with the conductive polishing article 203 and/or abrasives, may be used to improve planarity and improve removal rate of these conductive materials.

The barrier ECMP composition includes an acid based electrolyte system for providing electrical conductivity. Suitable acid based electrolyte systems include, for example, sulfuric acid based electrolytes, phosphoric acid based electrolytes, boric acid based electrolytes, nitric acid based electrolytes, perchloric acid based electrolytes, carboxylic acid based electrolytes, such as acetic acid and citric acid, or combinations thereof. Suitable acid based electrolyte systems include an acid based electrolyte as well as acid electrolyte derivatives, including ammonium, potassium, sodium, calcium and metal salts thereof. The acid based electrolyte system may comprise two or more acid based electrolytes, such as a combination of sulfuric acid and phosphoric acid. The acid based electrolyte system may also buffer the barrier ECMP composition to maintain a desired pH level for processing a substrate.

Examples of suitable acid based electrolytes include compounds having a phosphate group ($PO_4^{3-}$), such as, phosphoric acid, metal phosphate salts, potassium phosphates ($K_xH_{(3-x)}PO_4$) (x=1, 2 or 3), such as potassium dihydrogen phosphate ($KH_2PO_4$), dipotassium hydrogen phosphate ($K_2HPO_4$), ammonium phosphates (($NH_4)_xH_{(3-x)}PO_4$) (x=1, 2 or 3), such as ammonium dihydrogen phosphate (($NH_4$)

$H_2PO_4$), diammonium hydrogen phosphate (($NH_4$)$_2HPO_4$), compounds having a nitrite group ($NO_3^{1-}$), such as, nitric acid or metal nitrate, compounds having a boric group ($BO_3^{3-}$), such as, orthoboric acid ($H_3BO_3$) and compounds having a sulfate group ($SO_4^{2-}$), such as sulfuric acid ($H_2SO_4$), metal sulfuric salts, ammonium hydrogen sulfate (($NH_4$)$HSO_4$), ammonium sulfate, (($NH_4$)$_xH_{(2-x)}SO_3$) (x=1 or 2), potassium sulfates ($K_xH_{(2-x)}SO_4$) (x=1 or 2), derivatives thereof and combinations thereof. The invention also contemplates that conventional electrolytes known and unknown may also be used in forming the barrier ECMP composition described herein using the processes described herein.

The acid based electrolyte system may contains an acidic component that can take up about 0.5 and about 20 percent by weight (wt %) or volume (vol %) of the total barrier ECMP composition to provide suitable conductivity for practicing the processes described herein. Examples of acidic components include sulfuric acid and/or phosphoric acid and may be present in the barrier ECMP composition in amounts between about 0.1% and about 15 wt. %, for example between about 0.5% and about 4 wt. %.

One aspect or component of the present invention is the use of one or more etching agents. The etching agents may etch material from the substrate surface, be chelating agents to complex with the surface of the substrate to enhance the electrochemical dissolution process, or both. The etching agents may also be used to buffer the barrier ECMP composition to maintain a desired pH level for processing a substrate. The etching agents may also form or enhance the formation of a passivation layer on the substrate surface.

The one or more etching agents can include compounds having one or more functional groups selected from the group of amine groups, amide groups, carboxylate groups, dicarboxylate groups, tricarboxylate groups, hydroxyl groups, a mixture of hydroxyl and carboxylate groups, and combinations thereof. The one or more etching agents may also include salts of the etching agents described herein. The barrier ECMP composition may include one or more etching agents at a concentration between about 0.1% and about 15% by volume or weight, but preferably utilized between about 0.1% and about 4% by volume or weight.

Examples of suitable etching agents having one or more carboxylate groups include citric acid, tartaric acid, succinic acid, oxalic acid, amino acids, salts thereof, and combinations thereof. For example, etching agents may include salts such as ammonium citrate, potassium citrate, ammonium succinate, potassium succinate, ammonium oxalate, potassium oxalate, potassium tartrate, and combinations thereof. The salts may have multi-basic states, for example, citrates have mono-, di- and tri-basic states. Other suitable etching agents having one or more carboxylate groups include acetic acid, imidodiacetic acid, adipic acid, butyric acid, capric acid, caproic acid, caprylic acid, glutaric acid, glycolic acid, formaic acid, fumaric acid, lactic acid, lauric acid, malic acid, maleic acid, malonic acid, myristic acid, plamitic acid, phthalic acid, propionic acid, pyruvic acid, stearic acid, valeric acid, derivatives thereof, salts thereof and combinations thereof. The etching agents having one or more carboxylate groups may include amino acids.

Further examples of suitable etching agents include compounds having one or more amine and amide functional groups, such as ethylenediamine (EDA), diethylenetriamine, diethylenetriamine derivatives, hexadiamine, amino acids, glycine, ethylenediaminetetraacetic acid (EDTA), methylformamide, derivatives thereof, salts thereof and combinations thereof. For example, EDTA includes the acid as well as a variety of salts, such as sodium, potassium and calcium (e.g., $Na_2EDTA$, $Na_4EDTA$, $K_4EDTA$ or $Ca_2EDTA$).

In any of the embodiments described herein, salts of the etching agents may be used in the barrier ECMP composition. The barrier ECMP composition may include one or more salts at a concentration between about 0.1% and about 15% by volume or weight of the barrier ECMP composition, for example, between about 0.1% and about 8% by volume or weight. Examples of suitable inorganic or organic acid salts include ammonium and potassium salts or organic acids, such as ammonium oxalate, ammonium citrate, ammonium succinate, monobasic potassium citrate, dibasic potassium citrate, tribasic potassium citrate, potassium tartarate, ammonium tartarate, potassium succinate, potassium oxalate, and combinations thereof. Additionally, ammonium and potassium salts of the carboxylate acids may also be used.

In any of the embodiments described herein, the etching inhibitors can be added to reduce the etching, oxidation, or corrosion of conductive materials by forming a passivation layer that minimizes the chemical interaction between the conductive material and the surrounding electrolyte. The layer of material formed by the etching inhibitors thus tends to suppress or minimize the electrochemical current from the substrate surface to limit electrochemical deposition and/or dissolution. The etching inhibitors are believe to reduce the etching rate of conductive materials, such as tungsten or copper, and allow more selective removal of barrier materials, such as titanium and titanium nitride, or other barrier materials as described herein. The barrier ECMP composition may include between about 0.001% and about 5.0%, such as between about 0.01% and about 0.5%, for example, between about 0.2% and about 0.4% by weight by weight of etching inhibitor.

Examples of suitable etching inhibitors include polyacrylic acid polymers, such as polymethylacrylic acids, polycarboxylic acid, polycarboxylate copolymers, polyphosphate, or combinations thereof.

Alternatively, polymeric inhibitors, for non-limiting examples, polyalkylaryl ether phosphate or ammonium nonylphenol ethoxylate sulfate, may be used in replacement or conjunction with the etching inhibitors in an amount between about 0.002% and about 1.0% by volume or weight of the barrier ECMP composition.

Corrosion inhibitor having one or more azole groups may also be used with the etching inhibitors. Examples of organic compounds having azole groups include benzotriazole (BTA), mercaptobenzotriazole, 5-methyl-1-benzotriazole (TTA), and combinations thereof. Other suitable corrosion inhibitors include film forming agents that are cyclic compounds, for example, imidazole, benzimidazole, triazole, and combinations thereof. Derivatives of benzotriazole, imidazole, benzimidazole, triazole, with hydroxy, amino, imino, carboxy, mercapto, nitro and alkyl substituted groups may also be used as corrosion inhibitors. Other corrosion inhibitor includes urea and thiourea among others.

In one embodiment of the barrier ECMP composition, one or more activating agents may be introduced into the barrier ECMP composition to improve the removal rate of the barrier materials, such as titanium or titanium nitride. The activating agents may be present in the barrier ECMP composition between about 100 part per billion (ppb) and about 0.5 wt. %, such as between about 1 part per million (ppm) and about 0.5 wt. %, including between 0.001 and about 0.1 wt. %. The ECMP barrier polishing composition may include between about 10 ppm and about 500 ppm, for example, about 200 ppm of one or more activating agents.

One class of activating agents includes iron compounds having metallic ($Fe^0$), ferrous ($Fe^{2+}$) and ferric ($Fe^{3+}$) oxidation states. Iron compounds include ferric salts and ferrous salts of nitrate, sulfate, phosphate, halide, triflate ($O_2SOCF_3^{1-}$), hydrate, derivatives thereof and combinations thereof. Specific example of useful iron compounds for activating agents include ferric nitrate ($Fe(NO_3)_3$), ferric sulfate ($Fe_2(SO_4)_3$), ferric triflate ($Fe(O_2SOCF_3)_3$), ferric chloride ($FeCl_3$), ferrocene (($C_5H_5$)$_2$Fe), ferrocenium nitrate, ferrocenium triflate, ferrocenium chloride, ions thereof, hydrates thereof, derivatives thereof or combinations thereof. Other ferrocene or ferrocenium compounds may include ($R_{5-x}$ $C_5H_x$)Fe($R'_{5-y}C_5H_y$) where any R and R' is independently methyl, ethyl, propyl, butyl, penta or other alkyl group and x and y are independently 0, 1, 2, 3, 4 or 5 for either cyclopentadienyl group. Aluminum compounds having oxidation states of $Al^{1+}$, $Al^{2+}$, and $Al^{3+}$ may also be used. Examples of aluminum compounds include aluminum salts, such as aluminum hexafluorosilicate ($Al_2(SiF_6)_3$), aluminum ammonium sulfate (($NH_4$)Al($SO_4$)$_2$), and aluminum nitrate (Al$(NO_3)_3$), or combinations thereof. Other aluminum containing compounds examples include triflate and chloride aluminum salts. Additionally, aluminum containing organometallic compounds that perform as activating agents may also be used in the ECMP barrier polishing composition.

Additional activating agents include hexafluorotitanium ($[TiF_6]^{2-}$) salts and hexafluorosilicon ($[SiF_6]^{2-}$) salts containing cations such as ammonium, tetramethylammonium, potassium, sodium, lithium or combinations thereof. such as metal ions capable of electron transfer with the barrier material to improve the removal rate of the barrier material.

It is believed the activating agents may also improve the selectivity of the barrier materials to the conductive materials and/or the dielectric materials used in forming features on the substrate surface. A selectivity of barrier to conductive materials and/or dielectric materials is an increased relative removal rate of barrier materials compared to the removal rate of conductive materials and/or dielectric materials. It is further believed that the activating agent is used as an oxidant to remove an electron from the barrier material forming a barrier material ion that may then dissolve into composition. A chelating agent may react with the barrier material ion to accelerate dissolution as well as increase solubility of the resulting compound in the barrier ECMP composition during processing.

Additionally, it is believed that while ferric compounds have an active role during the oxidation process of barrier materials, iron compounds containing metallic iron or ferrous atoms may be oxidized by the chemical or electrical conditions within the composition to form ferric compounds. For example, a compound containing metallic iron is oxidized or a ferrous compound is further oxidized to a higher oxidations state, for example, a ferric compound, by an electrical potential or by a stronger oxidizer, for example, hydrogen peroxide, within the composition.

One or more pH adjusting agents is preferably added to the barrier ECMP composition to achieve a pH between about 2 and about 10. The pH may vary on the conductive material disposed adjacent the barrier material. For example if a barrier material, such as titanium nitride is used adjacent a tungsten material, a basic pH, such as between about 2 and about 4 may be used for the barrier ECMP composition. If the barrier material is used adjacent a copper material, the barrier ECMP composition may have a pH between about 6 and about 10 may be used.

The amount of pH adjusting agent can vary as the concentration of the other components is varied in different formulations, but in general the total composition may include up and about 70 wt % of the one or more pH adjusting agents, but preferably between about 0.2% and about 25% by volume. Different compounds may provide different pH levels for a given concentration, for example, the barrier ECMP composition may include between about 0.1% and about 10% by volume of a base, such as potassium hydroxide, ammonium hydroxide, sodium hydroxide or combinations thereof, providing the desired pH level. One example pH adjuster is potassium hydroxide at a concentration of between about 1% and about 3% by volume.

The one or more pH adjusting agents can be chosen from a class of organic acids, for example, carboxylic acids, such as acetic acid, citric acid, oxalic acid, phosphate-containing components including phosphoric acid, ammonium phosphates, potassium phosphates, and combinations thereof, or a combination thereof. Inorganic acids including phosphoric acid, sulfuric acid, hydrochloric, nitric acid, derivatives thereof and combinations thereof, may also be used as a pH adjusting agent in the barrier ECMP composition.

It is believed that the selective pH to different compounds allows for the respective conductive material to be protected, i.e., a reduced or minimized removal rate, from removal during barrier polishing. For example, the formation of a tungsten oxide, which is pH dependent of a pH of between about 2 and about 4, may be used in barrier with tungsten polishing while a copper polishing composition that allows for oxidizing and passivating copper at a pH of between about 6 and about 10 allows for copper protection during barrier with copper polishing.

The balance or remainder of the barrier ECMP composition described herein is a solvent, such as a polar solvent, including water, preferably deionized water. Other solvent may be used solely or in combination with water, such as organic solvents. Organic solvents include alcohols, such as isopropyl alcohol or glycols, ethers, such as diethyl ether, furans, such as tetrahydrofuran, hydrocarbons, such as pentane or heptane, aromatic hydrocarbons, such as benzene or toluene, halogenated solvents, such as methylene chloride or carbon tetrachloride, derivatives, thereof and combinations thereof.

While the compositions described herein are oxidizer free and/or abrasive free compositions, the invention contemplates the use of one or more surface finish enhancing and/or removal rate enhancing materials including abrasive particles, one or more oxidizers, and combinations thereof.

Abrasive particles may be used to improve the surface finish and removal rate of conductive materials from the substrate surface during polishing. The addition of abrasive particles to the barrier ECMP composition can allow the final polished surface to achieve a surface roughness of that comparable with a conventional CMP process even at low polishing article pressures. Surface finish, or surface roughness, has been shown to have an effect on device yield and post polishing surface defects. Abrasive particles may comprise up and about 30 wt % of the barrier ECMP composition during processing. A concentration between about 0.001 wt % and about 5 wt % of abrasive particles may be used in the barrier ECMP composition.

Suitable abrasives particles include inorganic abrasives, polymeric abrasives, and combinations thereof. Inorganic abrasive particles that may be used in the electrolyte include, but are not limited to, silica, alumina, zirconium oxide, titanium oxide, cerium oxide, germania, or any other abrasives of metal oxides, known or unknown. For example, colloidal silica may be positively activated, such as with an alumina modification. The typical abrasive particle size used in one embodiment of the current invention is generally between about 1 nm and about 1,000 nm, preferably between about 10 nm and about 100 nm. Generally, suitable inorganic abrasives have a Mohs hardness of greater than 6, although the invention contemplates the use of abrasives having a lower Mohs hardness value.

The polymer abrasives described herein may also be referred to as "organic polymer particle abrasives", "organic abrasives" or "organic particles." The polymeric abrasives may comprise abrasive polymeric materials. Examples of polymeric abrasives materials include polymethylmethacrylate, polymethyl acrylate, polystyrene, polymethacrylonitrile, and combinations thereof.

The polymeric abrasives may have a Hardness Shore D of between about 60 and about 80, but can be modified to have greater or lesser hardness value. The softer polymeric abrasive particles can help reduce friction between a polishing article and substrate and may result in a reduction in the number and the severity of scratches and other surface defects as compared to inorganic particles. A harder polymeric abrasive particle may provide improved polishing performance, removal rate and surface finish as compared to softer materials.

The hardness of the polymer abrasives can be varied by controlling the extent of polymeric cross-linking in the abrasives, for example, a higher degree of cross-linking produces a greater hardness of polymer and, thus, abrasive. The polymeric abrasives are typically formed as spherical shaped beads having an average diameter between about 0.1 micron and about 20 microns or less.

The polymeric abrasives may be modified to have functional groups, e.g., one or more functional groups, that have an affinity for, i.e., can bind to, the conductive material or conductive material ions at the surface of the substrate, thereby facilitating the ECMP removal of material from the surface of a substrate. For example, the organic polymer particles can be modified to have an amine group, a carboxylate group, a pyridine group, a hydroxide group, ligands with a high affinity for desired removal materials, or combinations thereof, to bind the removed materials as substitutes for or in addition to the chemically active agents in the barrier ECMP composition, such as the etching agents or etching inhibitors. The substrate surface material, may be in any oxidation state, such as 0, 1+, 2+, 3+ and 4+, such as for titanium oxidation states, and further up to 5+ for tantalum oxidation states, before, during or after ligating with a functional group. The functional groups can bind to the metal material(s) on the substrate surface to help improve the uniformity and surface finish of the substrate surface.

Additionally, the polymeric abrasives have desirable chemical properties, for example, the polymer abrasives are stable over a broad pH range and are not prone to aggregating to each other, which allow the polymeric abrasives to be used with reduced or no surfactant or no dispersing agent in the barrier ECMP composition.

Alternatively, inorganic particles coated with the polymeric materials described herein may also be used with the barrier ECMP composition. It is within the scope of the current invention for the barrier ECMP composition to contain polymeric abrasives, inorganic abrasives, the polymeric coated inorganic abrasives, and any combination thereof depending on the desired polishing performance and results.

One or more oxidizers may be used herein to enhance the removal or removal rate of the conductive material from the substrate surface. An oxidizing agent is generally an agent that reacts with a material by accepting an electron(s). In the current embodiment the oxidizer is used to react with the surface of the substrate that is to be polished, which then aids in the removal of the desired material. For example, an oxidizer may be used to oxidize a metal layer to a corresponding oxide or hydroxide. Existing metal (M) that has been oxidized, including $M^{1+}$ ions, may further be oxidized to a higher oxidation state, such as $M^{2+}$, $M^{3+}$, $M^{4+}$, and $M^{5+}$ ions, which may then promote the reaction with one or more of the etching agents. Also, in some instances the oxidizing agent can be used in some chemistries (e.g., low pH) that can enhance the chemical etching of the surface of the substrate to further increase the removal rate from the anode surface. In cases where no bias is applied to the surface of the substrate the inhibitors and etching agents will complex with the metal ions on the surface that become dislodged from the surface due to the relative motion and pressure applied by the conductive polishing article 203. The addition of abrasives can further improve the removal rate of the complexed metal ions due to the abrasive particles ability to increase that contact area between the conductive polishing article 203 and the substrate surface.

In the case of ECMP, the conductive layer on the substrate surface is biased anodically above a threshold potential, by use of the power source 224 and the electrode 209, thus causing the metal on the substrate surface to "oxidize" (i.e., a metal atom gives up one or more electrons to the power source 224). The ionized or "oxidized" metal atoms thus dissolve into the electrolyte composition with the help of components in the electrolyte. Due to the presence of the inhibitors and/or etching agents found in the barrier ECMP composition, the electrochemical dissolution process of the metal ions into the electrolyte is more limited than a barrier ECMP composition which does not contain these components. The presence of the inhibitors and/or etching agents also appears to have an effect on the attachment strength of the metal ion(s) and inhibitor and/or etching agent complex to the surface of the substrate. It has been found that in one embodiment that the removal rate in an ECMP process can be increased by the addition of an oxidizing agent. It is thought that the oxidizing agent tends to further oxidize the metal ions formed due to the anodic bias, which in some materials brings it to the more stable oxidation states. The inhibitors and/or etching agents found in the barrier ECMP composition complex with the oxidized metal ions which tend to have a lower attachment, or bond, strength due to the way the inhibitor bonds to the oxidized metal ion and metal surface. The lower attachment strength allows the complexed metal ion to be more easily and efficiently removed due to the interaction of the substrate surface and the conductive polishing article 203. The addition of abrasives to the ECMP polishing composition can further improve the removal rate of the complexed metal ions due to the abrasive particles' ability to increase contact area between the conductive polishing article 203 and the substrate surface.

Further, controlling the amounts and types of constituents of the barrier ECMP composition, such as etching inhibitors and oxidizers, can result in tuning the desired removal rate of the process. For example reduced amounts of etching inhibitor will result in an increase in the material removal rate as compared to compositions having higher etching inhibitor concentrations. In cases where the barrier ECMP composition does not contain etching inhibitors the ECMP material removal rate is greatly increased over a barrier ECMP composition which contains etching inhibitor due to the formation of the metal ions and inhibitor complex which tends to shield the surface of the substrate to the electrolyte. Likewise reduced amounts of oxidizers will generally result in lower removal rates compared to compositions having higher oxidizer compositions. It has been suggested that at low concentrations of the oxidizer, the etching inhibitor and/or etching agent can complex with a metal ion before it becomes oxidized further by the oxidizing agent due to kinetic effects limiting the supply of the oxidizer to the surface of the substrate. The etching inhibitor and metal ion complex can thus affect the removal efficiency due to the formation of the stronger attachment strength complexed metal ions.

The oxidizer can be present in the barrier ECMP composition in an amount ranging between about 0.01% and about 30% by volume or weight, for example, between about 0.1% and about 20% by volume or weight. In an embodiment of the barrier ECMP composition, between about 0.1% and about 10% by volume or weight of hydrogen peroxide is present in the barrier ECMP composition. In one embodiment, the oxidizer is added to the rest of the barrier ECMP composition just prior to beginning the ECMP process. Examples of suitable oxidizers include peroxy compounds, e.g., compounds that may disassociate through hydroxy radicals, such as hydrogen peroxide and its adducts including urea hydrogen peroxide, percarbonates, and organic peroxides including, for example, alkyl peroxides, cyclical or aryl peroxides, benzoyl peroxide, peracetic acid, and ditertbutyl peroxide. Sulfates and sulfate derivatives, such as monopersulfates and dipersulfates may also be used including for example, ammonium peroxydisulfate, potassium peroxydisulfate, ammonium persulfate, and potassium persulfate. Salts of peroxy compounds, such as sodium percarbonate and sodium peroxide may also be used.

The oxidizing agent can also be an inorganic compound or a compound containing an element in its highest oxidation state. Examples of inorganic compounds and compounds containing an element in its highest oxidation state include but are not limited to periodic acid, periodate salts, perbromic acid, perbromate salts, perchloric acid, perchloric salts, perbonic acid, nitrate salts (such as cerium nitrate, iron nitrate, ammonium nitrate), ferrates, perborate salts and permanganates. Other oxidizing agents include bromates, chlorates, chromates, iodates, iodic acid, and cerium (IV) compounds such as ammonium cerium nitrate.

The barrier ECMP composition may include one or more additive compounds. Additive compounds include electrolyte additives including, but not limited to, suppressors, enhancers, levelers, brighteners, stabilizers, and stripping agents to improve the effectiveness of the barrier ECMP composition in polishing of the substrate surface. For example, certain additives may decrease the ionization rate of the metal atoms, thereby inhibiting the dissolution process, whereas other additives may provide a finished, shiny substrate surface. The additives may be present in the barrier ECMP composition in concentrations up and about 15% by weight or volume, and may vary based upon the desired result after polishing.

Surfactants may be one such additive compound in the barrier ECMP composition. One or more surfactants may be used in the barrier ECMP composition to increase the dissolution or solubility of materials, such as metals and metal ions or by-products produced during processing, improve chemical stability, and reduce decomposition of components of the barrier ECMP composition. The one or more surfactants can comprise a concentration between about 0.001% and about 10% by volume or weight of the barrier ECMP composition. A concentration between about 0.01% and about 2% by volume or weight, for example between about 0.1% and about 1% by volume or weight, of the surfactants may be used in one embodiment of the barrier ECMP composition. The one or more surfactants may include non-ionic surfactants as well as ionic surfactants including anionic surfactants, cationic surfactants, amphoteric surfactants, and ionic surfactants having more than one ionic functional group, such as Zwitterionic surfactants. Dispersers or dispersing agents are considered to be surfactants as surfactants are used herein.

Other examples of additives include one or more leveling agents, which are broadly defined herein as additives that suppress dissolution current on the surface of a substrate. Leveling agents suppress dissolution current by attaching to conductive materials, by inhibiting the electrochemical reactions between the electrolyte and conductive material, and/or form depolarizing agents that limit electrochemical reactions. A concentration of leveling agents between about 0.005% and about 10% by volume or weight, for example, between about 0.05% and about 2% by volume or weight of the electrolyte composition can be used.

Leveling agents include, but are not limited to, polyethylene glycol (PEG) and polyethylene glycol derivatives. Other leveling agents which can be employed in the process described herein include any employed in the electroplating or electropolishing art, such as polyamines, polyamides and polyimides including polyethyleneimine, polyglycine, 2-amino-1-naphthalenesulfonic acid, 3-amino-1-propanesulfonic acid, 4-aminotoluene-2-sulfonic acid. Leveling agents may be added to the barrier ECMP composition in a range between about 0.05% and about 5% by volume or weight of the barrier ECMP composition. For example, PEG may be added to a polishing composition with a concentration about 0.2 wt %.

One or more stabilizers may be present in an amount that is sufficient to produce measurable improvements in barrier ECMP composition stability. The one or more stabilizers may be present in an amount ranging between about 100 ppm and about 5.0 weight percent (wt %). Non-limiting examples of preferred stabilizers include but are not limited to phosphoric acids and phosphoric acid derivatives including aminotri(methylenephosphonic) acid, 1-hydroxyethylidene-4-diphosphonic acid, hexamethylenediaminetetramethylene phosphoric acid, and diethylenetetramine pentamethylenephosphonic acid, and derivative salts thereof.

Accelerators are another example of an additive that may be included in the barrier ECMP composition. Accelerators increase electrochemical reactions of metals disposed on the substrate surface to increase metal removal. The barrier ECMP composition may include one or more accelerators at a concentration between about 0.001% and about 1% by volume or weight, for example, between about 0.25% and about 0.8% by volume or weight. Accelerators may include sulfur-containing compounds, such as sulfite or di-sulfate.

Further examples of additives to the barrier ECMP composition position are more fully described in U.S. patent application Ser. No. 10/141,459, filed on May 7, 2002, which is incorporated by reference herein to the extent not inconsistent with the claimed aspects and disclosure herein.

Polishing compositions utilized during embodiments herein are advantageous for ECMP processes in removing barrier materials. Generally, ECMP compositions are much more conductive than traditional CMP compositions. The ECMP compositions have a conductivity of about 10 millisiemens (ms) or higher, while traditional CMP compositions have a conductivity between about 3 ms and about 5 ms. The conductivity of the ECMP compositions greatly influences that rate at which the ECMP process advances, i.e., more conductive compositions have a faster material removal rate. For removing bulk material, the ECMP composition has a conductivity of about 10 ms or higher, preferably in a range between about 30 ms and about 60 ms. For residual material, the ECMP composition has a conductivity of about 10 ms or higher, preferably in a range between about 15 ms and about 40 ms. An example barrier ECMP composition used to remove barrier materials includes sulfuric acid, at least one etching agent, an etching inhibitor, an activating agent, a pH adjusting agent, an oxidizer, and abrasive particulates.

Power may be applied to the substrate having a barrier material layer formed thereon in a process apparatus, such as cell 200 described above, by applying a bias between an electrode 209 and the substrate 208 to remove the barrier material.

In an example of an ECMP polishing process of the present invention, a substrate 208 is disposed in the polishing head 202 used in a planarization process as shown in FIG. 1. The polishing head 202 applies pressure to the substrate 208, which is in contacts with the pad assembly 222, at a pressure of less than about 2 psi, such as in a range between about 0.01 psi and about 1.5 psi, for example, between about 0.1 psi and about 0.5 psi.

The polishing article assembly 222 is disposed in a basin containing an electrolyte described herein. The substrate 208 is exposed to the barrier ECMP composition and electrically contacted with conductive polishing article 203. A bias from a power source 224 is then applied between the substrate 208 and the electrode 209. The bias is generally provided to produce anodic dissolution of the barrier material from the surface of the substrates at a current density up and about 20 milliamps/cm$^2$ for substrates up and about 300 mm in diameter. For example, between about 0.01 milliamps/cm$^2$ and about 20 milliamps/cm$^2$ for a 200 mm substrate.

The bias may be varied in power and application depending upon the user requirements in removing material from the substrate surface. The bias may also be applied by an electrical pulse modulation technique, which applies a constant current density or voltage for a first time period, then applies a constant reverse current density or voltage for a second time period, and repeats the first and second steps, as is described in co-pending U.S. Pat. No. 6,379,223, entitled "Method And Apparatus For Electrochemical Mechanical Planarization", issued on Apr. 22, 2002, which is incorporated by reference herein to the extent not inconsistent with the claimed aspects and disclosure herein.

By use of the current invention by biasing the substrate surface, containing barrier material, a removal rate of up to about 2000 Å/min of can be achieved. Higher removal rates are generally desirable, but due to the goal of maximizing process uniformity and other process variables (for example, reaction kinetics at the anode and cathode) it is common for dissolution rate to be controlled between about 100 Å/min and about 1000 Å/min. The substrate is typically exposed to the polishing composition and power application for a period of time sufficient to remove at least a portion or all of the desired material disposed thereon.

While there are many theories as to the exact mechanism behind the ECMP planarization process, it is believed that the planarization process occurs as follows. A passivation layer, which chemically and/or electrically insulates the surface of the substrate, is formed from the exposure of the substrate surface to the etching inhibitor, or other materials capable of forming a passivating or insulating film, for example oxidizers, etching agents and/or additives. An electrical bias is applied to enhance the electrochemical dissolution of the surface material, such as barrier materials, from the substrate surface. By use of mechanical means to disturb the passivation layer on the surface of the substrate, such as the polishing head 202 urging the substrate against the conductive polishing article 203, a region of non-passivated material is exposed.

The process of exposing the underlying substrate surface enhances electrochemical dissolution and/or chemical interaction in these newly exposed regions. The exposed regions will remain exposed for short a period of time before the passivation layer is formed again, which thus tends to regulate the dissolution process in the various localized areas. The passivation layer is retained in areas not in contact with the conductive polishing article 203, such as recesses or valleys on the substrate surface, and thus the dissolution and chemical interaction is minimized.

The addition of inorganic or organic abrasive component (s), even at low to moderate polishing article pressures, tends to improve the dissolution rate further, (than without the addition of the abrasive particles) likely due to the increased ability of the conductive polishing article 203 to disturb and expose the underlying substrate surface. The high points on topography formed during prior semiconductor processes and any surface roughness created due to preferential electrochemical dissolution (for example, etching along grain boundaries) or chemical attack, the contact of the abrasive and conductive polishing article 203 surfaces will tend to disturb the passivating layer on the highest points allowing preferential etching of these exposed areas.

The exposure of the high points to increased electrochemical etching thus tends to reduce localized roughness and tends to planarize the surface of the substrate. Preferential attack of localized roughness will also have the property of improving the surface finish of the substrate. It has been found that using the above mentioned chemistry and a oxidizing agent and/or abrasive particles at a polishing article pressure of approximately 0.5 psi the overall dissolution (or etch) rate has been increased by a factor of nearly two.

Further, even though the pressure applied to the substrate tends to be below a value that would tend to generate appreciable convention mechanical polishing abrasion, which convention CMP processes have a pressure of about 2-6 psi, the addition of the abrasives may still also tend to deform or abrade localized surface roughness highpoints thus further improving the surface finish of the polished substrate. Lower polishing pressures correspond to lower shear forces and frictional forces which make this process suitable for planarizing substrate surfaces sensitive to contact pressures between the substrate and conductive polishing article 203, such as low k dielectric materials, with reduced or minimal deformations and defect formation from polishing. Further, the lower shear forces and frictional forces have been observed to reduce or minimize formation of topographical defects, such as dishing and scratches, during polishing.

The following non-limiting examples are provided to further illustrate embodiments of the invention. However, the examples are not intended to be all-inclusive and are not intended to limit the scope of the inventions described herein.

EXAMPLES OF POLISHING COMPOSITIONS

Examples of polishing compositions for polishing bulk tungsten material and residual tungsten materials are provided as follows. Bulk tungsten polishing compositions may include:

Example #1 about 2 vol % of sulfuric acid;
about 2 wt % of ammonium citrate;
about 2 wt % of ethylenediamine;
potassium hydroxide to provide a pH between about 8.4 and about 8.9; and
deionized water.

Example #2 about 4 vol % of sulfuric acid;
about 2 wt % of ammonium citrate;
about 2 wt % of ethylenediamine;
potassium hydroxide to provide a pH between about 8 and about 9; and
deionized water.

Example #3 about 1.5 vol % of sulfuric acid;
about 2.5 vol % of phosphoric acid;
about 2 wt % of ammonium citrate;
about 2 wt % of ethylenediamine;
potassium hydroxide to provide a pH between about 8 and about 9; and
deionized water.

Example #4 about 1 vol % of sulfuric acid;
about 2 vol % of phosphoric acid;
about 2 wt % of ammonium citrate;
potassium hydroxide to provide a pH between about 8 and about 9; and
deionized water.

Example #5 about 2 vol % of sulfuric acid;
about 2 vol % of phosphoric acid;
about 2 wt % of ammonium citrate;
about 2 wt % of ethylenediamine;
potassium hydroxide to provide a pH between about 8.4 and about 8.9; and
deionized water.

Example #6 about 2 vol % of sulfuric acid;
about 2 vol % of salicylic acid;
potassium hydroxide to provide a pH between about 8 and about 9; and
deionized water.

Example #7 about 2 vol % of sulfuric acid;
about 2 vol % of phosphoric acid;
about 2 wt % of ammonium citrate;
potassium hydroxide to provide a pH of about 8.7; and
deionized water.

Example #8 about 2 vol % of sulfuric acid;
about 2 vol % of phosphoric acid;
about 2 wt % of ammonium citrate;
about 2 wt % of ethylenediamine;
potassium hydroxide to provide a pH of about 8.7; and
deionized water.

Example #9 about 2 vol % of sulfuric acid;
about 2 wt % of ammonium citrate;
about 2 wt % of ethylenediamine;
potassium hydroxide to provide a pH between about 8 and about 9; and
deionized water.

Example #10 about 2 vol % of sulfuric acid;
about 2 vol % of phosphoric acid;
potassium hydroxide to provide a pH between about 8 and about 9; and
deionized water.

Example #11 about 4 vol % of phosphoric acid;
about 2 wt. % of ammonium citrate;
about 2 wt. % of ethylenediamine;
potassium hydroxide to provide a pH between about 8 and about 9; and
deionized water.

Example #12 about 2 vol % of phosphoric acid;
about 2 wt % of ammonium citrate;
about 2 wt % of ethylenediamine;
potassium hydroxide to provide a pH between about 8.4 and about 8.9; and
deionized water.

Example #13 about 2 vol % of nitric acid;
about 2 vol % of phosphoric acid;
about 2 wt % of ammonium citrate;
about 2 wt % of ethylenediamine;
potassium hydroxide to provide a pH between about 8.4 and about 8.9; and
deionized water.

Example #14 about 2 vol % of nitric acid;
about 2 vol % of phosphoric acid;
about 2 wt % of ammonium citrate;
about 2 wt % of ethylenediamine;
potassium hydroxide to provide a pH of about 8.5; and
deionized water.

Example #15 about 4 vol % of nitric acid;
about 2 wt % of ammonium citrate;
about 2 wt % of ethylenediamine;
potassium hydroxide to provide a pH between about 8 and about 9; and
deionized water.

Example #16 about 1.5 vol % of sulfuric acid;
about 2.5 vol % of phosphoric acid;
about 2 wt % of ammonium citrate;
about 2 wt % of ethylenediamine;
potassium hydroxide to provide a pH of about 8.5; and
deionized water.

Residual tungsten polishing compositions may include:

Example #1 about 1 vol % of sulfuric acid;
about 1 wt. % of ammonium citrate;
potassium hydroxide to provide a pH between about 6 and about 7; and
deionized water.

Example #2 about 1 vol % of sulfuric acid;
about 1.5 vol % of phosphoric acid;
about 0.5 wt. % of ammonium citrate;
potassium hydroxide to provide a pH between greater than 6 and less than 7; and
deionized water.

Example #3 about 4 vol % of phosphoric acid;
about 0.5 wt. % of ammonium citrate;
potassium hydroxide to provide a pH between about 6 and about 7; and
deionized water.

Example #4 about 1 vol % of sulfuric acid;
about 1.5 vol % of phosphoric acid;
about 1 wt. % of salicylic acid;
potassium hydroxide to provide a pH between about 6 and about 7; and
deionized water.

Example #5 about 2 vol % of sulfuric acid;
about 2 vol % of phosphoric acid;
about 0.5 wt. % of ammonium citrate;
potassium hydroxide to provide a pH between greater than 6 and less than 7; and
deionized water.

Example #6 about 2 vol % of sulfuric acid;
about 2 vol % of phosphoric acid;
potassium hydroxide to provide a pH between about 6 and about 7; and
deionized water.

Example #7 about 1 vol % of sulfuric acid;
about 1.5 vol % of phosphoric acid;
about 0.5 wt % of ammonium citrate;
potassium hydroxide to provide a pH between about 6.4 and about 6.8; and
deionized water.

Example #8 about 1 vol % of nitric acid;
about 1.5 vol % of phosphoric acid;
about 0.5 wt % of ammonium citrate;
potassium hydroxide to provide a pH between about 6.4 and about 6.8; and
deionized water.

Example #9 about 2 vol % of nitric acid;
about 2 vol % of phosphoric acid;
about 0.5 wt. % of ammonium citrate;
potassium hydroxide to provide a pH between about 6 and less than 7; and
deionized water.

Example #10 about 1 vol % of sulfuric acid;
about 1.5 vol % of phosphoric acid;
about 0.5 wt % of ammonium citrate;
potassium hydroxide to provide a pH of about 6.5; and
deionized water.

Examples of polishing compositions for CMP polishing barrier materials are provided as follows. CMP Barrier polishing compositions may include:

Example #1 about 3 wt. % of hydrogen peroxide;
about 1 wt. % of ammonium citrate;
about 0.1 wt. % of polyacrylic acid;
about 4 wt % of alumina particles;
a pH between about 4 and about 5; and
a solvent.

Examples of polishing compositions for ECMP polishing barrier materials are provided as follows. ECMP Barrier polishing compositions may include:

Example #1 about 2% by volume phosphoric acid;
about 2% by weight ammonium citrate;
about 0.3% by weight benzotriazole;
about 0.01% by weight $(NH_4)_2SiF_6$;
between about 1% and about 3% by volume of potassium hydroxide to provide a pH of about 3; and
deionized water.

Example #2 about 2% by volume phosphoric acid;
about 2% by weight ammonium citrate;
about 0.3% by weight benzotriazole;
about 0.01% by weight $(NH_4)_2SiF_6$;
between about 1% and about 3% by volume of potassium hydroxide to provide a pH of about 3; and
deionized water.

Example #3 about 2% by volume phosphoric acid;
about 2% by weight citric acid;
about 0.3% by weight benzotriazole;
about 0.01% by weight $(NH_4)_2SiF_6$;
between about 1% and about 3% by volume of potassium hydroxide to provide a pH of about 9; and
deionized water.

Example #4 about 2% by volume phosphoric acid;
about 0.3% by volume sulfuric acid;
about 2% by weight ammonium citrate;
about 0.3% by weight benzotriazole;
about 0.01% by weight $(NH_4)_2SiF_6$;
between about 1% and about 3% by volume of potassium hydroxide to provide a pH of about 3; and
deionized water.

Example #5 about 2% by volume phosphoric acid;
about 0.3% by volume sulfuric acid;
about 2% by weight ammonium citrate;
about 0.3% by weight benzotriazole;
about 0.01% by weight $(NH_4)_2SiF_6$;
between about 1% and about 3% by volume of potassium hydroxide to provide a pH of about 9; and
deionized water.

Example #6 about 2% by volume phosphoric acid;
about 0.3% by volume sulfuric acid;
about 2% by weight ammonium citrate;
about 0.3% by weight benzotriazole;
about 0.01% by weight aluminum hexafluorosilicate;
between about 1% and about 3% by volume of potassium hydroxide to provide a pH of about 3; and
deionized water.

Example #7 about 2% by volume phosphoric acid;
about 2% by weight imidodiacetic acid;
about 0.3% by weight benzotriazole;
about 0.01% by weight $(NH_4)_2SiF_6$;
between about 1% and about 3% by volume of potassium hydroxide to provide a pH of about 3; and
deionized water.

Example #8 about 2% by volume phosphoric acid;
about 2% by weight imidodiacetic acid;
about 0.3% by weight benzotriazole;
about 0.01% by weight $(NH_4)_2SiF_6$;
between about 1% and about 3% by volume of potassium hydroxide to provide a pH of about 9; and deionized water.

EXAMPLES OF POLISHING PROCESSES

Example 1

A tungsten plated substrate with 300 mm diameter was polished and planarized using the following polishing composition within a modified cell on a REFLEXION® system, available from Applied Materials, Inc., of Santa Clara, Calif. A substrate having a tungsten layer of about 4,000 Å thick on the substrate surface was placed onto a carrier head in an apparatus having a first platen with a first polishing article disposed thereon. A first polishing composition was supplied to the platen at a rate of about 250 mL/min, and the first polishing composition comprising:

between about 2 vol % and about 3 vol % of sulfuric acid;
between about 2 vol % and about 4 vol % of phosphoric acid;
between about 2 wt. % and about 2.8 wt. % of ammonium citrate;
about 2 wt % of ethylenediamine;
potassium hydroxide to provide a pH between about 8 and about 9; and
deionized water.

The substrate was contacted with the first polishing article at a first contact pressure of about 0.3 psi, a first platen rotational rate of about 20 rpm, a first carrier head rotational rate of about 39 rpm and a first bias of about 2.9 volts was applied during the process. The substrate was polished and examined. The tungsten layer thickness was reduced to about 1,000 Å.

The substrate was transferred to over a second platen having a second polishing article disposed thereon. A second polishing composition was supplied to the platen at a rate of about 300 mL/min, and the second polishing composition comprising:

between about 1 vol % and about 2 vol % of sulfuric acid;
between about 1.5 vol % and about 2.5 vol % of phosphoric acid;
about 0.5 wt % of ammonium citrate;
potassium hydroxide to provide a pH between greater than 6 and less than 7; and
deionized water.

The substrate was contacted with the second polishing article at a second contact pressure of about 0.3 psi, a second platen rotational rate of about 14 rpm, a second carrier head rotational rate of about 29 rpm and a second bias of about 2.4 volts was applied during the process. The substrate was polished and examined. The excess tungsten layer formerly on the substrate surface was removed to leave behind the barrier layer and the tungsten trench.

The substrate was then transferred to a third platen and a third second polishing composition was supplied to the platen at a rate of about 250 ml/min, and the second polishing composition comprising:

about 3 wt. % of hydrogen peroxide;
about 1 wt. % of ammonium citrate;
about 0.1 wt. % of polyacrylic acid;
about 4 wt % of alumina particles;
a pH between about 4 and about 5; and
a solvent, and The substrate was contacted with the second polishing article at a second contact pressure of about 2 psi, a second platen rotational rate of about 80 rpm, a second carrier head rotational rate of about 80 rpm. The substrate was polished and examined. The titanium barrier layer formerly on the substrate surface was removed with minimal observable dishing and erosion.

Example 2

A tungsten plated substrate with 300 mm diameter was polished and planarized using the following polishing composition within a modified cell on a REFLEXION® system, available from Applied Materials, Inc., of Santa Clara, Calif. A substrate having a tungsten layer of about 4,000 Å thick on the substrate surface was placed onto a carrier head in an apparatus having a first platen with a first polishing article disposed thereon. A first polishing composition was supplied to the platen at a rate of about 250 mL/min, and the first polishing composition comprising:

about 3 vol % of sulfuric acid;
about 4 vol % of phosphoric acid;

about 2.8 wt % of ammonium citrate;
about 2 wt % of ethylenediamine;
potassium hydroxide to provide a pH between about 8 and about 9; and
deionized water.

The substrate was contacted with the first polishing article at a first contact pressure of about 0.3 psi, a first platen rotational rate of about 20 rpm, a first carrier head rotational rate of about 39 rpm and a first bias of about 2.9 volts was applied during the process. The substrate was polished and examined. The tungsten layer thickness was reduced to about 1,000 Å.

The substrate was transferred to over a second platen having a second polishing article disposed thereon. A second polishing composition was supplied to the platen at a rate of about 300 mL/min, and the second polishing composition comprising:
about 2 vol % of sulfuric acid;
about 2.5 vol % of phosphoric acid;
about 0.5 wt % of ammonium citrate;
potassium hydroxide to provide a pH between greater than 6 and less than 7; and
deionized water.

The substrate was contacted with the second polishing article at a second contact pressure of about 0.3 psi, a second platen rotational rate of about 14 rpm, a second carrier head rotational rate of about 29 rpm and a second bias of about 2.4 volts was applied during the process. The substrate was polished and examined. The excess tungsten layer formerly on the substrate surface was removed to leave behind the barrier layer and the tungsten trench.

The substrate was then transferred to a third platen and a third second polishing composition was supplied to the platen at a rate of about 250 ml/min, and the second polishing composition comprising:
about 3 wt. % of hydrogen peroxide;
about 1 wt. % of ammonium citrate;
about 0.1 wt. % of polyacrylic acid;
about 4 wt % of alumina particles;
a pH between about 4 and about 5; and
a solvent, and The substrate was contacted with the second polishing article at a second contact pressure of about 2 psi, a second platen rotational rate of about 80 rpm, a second carrier head rotational rate of about 80 rpm. The substrate was polished and examined. The titanium barrier layer formerly on the substrate surface was removed with minimal observable dishing and erosion.

Example 3

A tungsten plated substrate with 300 mm diameter was polished and planarized using the following polishing composition within a modified cell on a REFLEXION® system, available from Applied Materials, Inc., of Santa Clara, Calif. A substrate having a tungsten layer of about 4,000 Å thick on the substrate surface was placed onto a carrier head in an apparatus having a first platen with a first polishing article disposed thereon. A first polishing composition was supplied to the platen at a rate of about 250 mL/min, and the first polishing composition comprising:
about 2.5 vol % of sulfuric acid;
about 3 vol % of phosphoric acid;
about 2.4 wt % of ammonium citrate;
about 2 wt % of ethylenediamine;
potassium hydroxide to provide a pH between about 8 and about 9; and
deionized water.

The substrate was contacted with the first polishing article at a first contact pressure of about 0.3 psi, a first platen rotational rate of about 20 rpm, a first carrier head rotational rate of about 39 rpm and a first bias of about 2.9 volts was applied during the process. The substrate was polished and examined. The tungsten layer thickness was reduced to about 1,000 Å.

The substrate was transferred to over a second platen having a second polishing article disposed thereon. A second polishing composition was supplied to the platen at a rate of about 300 mL/min, and the second polishing composition comprising:
about 1.5 vol % of sulfuric acid;
about 2 vol % of phosphoric acid;
about 0.5 wt % of ammonium citrate;
potassium hydroxide to provide a pH between about 6.4 and about 6.8; and
deionized water.

The substrate was contacted with the second polishing article at a second contact pressure of about 0.3 psi, a second platen rotational rate of about 14 rpm, a second carrier head rotational rate of about 29 rpm and a second bias of about 2.4 volts was applied during the process. The substrate was polished and examined. The excess tungsten layer formerly on the substrate surface was removed to leave behind the barrier layer and the tungsten trench.

The substrate was then transferred to a third platen and a third second polishing composition was supplied to the platen at a rate of about 250 ml/min, and the second polishing composition comprising:
about 3 wt. % of hydrogen peroxide;
about 0.5 wt. % of ammonium citrate;
about 0.1 wt. % of polyacrylic acid;
about 2 wt % of alumina particles;
a pH between about 4 and about 5; and
a solvent, and The substrate was contacted with the second polishing article at a second contact pressure of about 2 psi, a second platen rotational rate of about 80 rpm, a second carrier head rotational rate of about 80 rpm. The substrate was polished and examined. The titanium barrier layer formerly on the substrate surface was removed with minimal observable dishing and erosion.

Example 4

A tungsten plated substrate with 300 mm diameter was polished and planarized using the following polishing composition within a modified cell on a REFLEXION® system, available from Applied Materials, Inc., of Santa Clara, Calif. A substrate having a tungsten layer of about 4,000 Å thick on the substrate surface was placed onto a carrier head in an apparatus having a first platen with a first polishing article disposed thereon. A first polishing composition was supplied to the platen at a rate of about 250 mL/min, and the first polishing composition comprising:
about 3 vol % of sulfuric acid;
about 3 vol % of phosphoric acid;
about 2 wt % of ammonium citrate;
about 2 wt % of ethylenediamine;
potassium hydroxide to provide a pH between about 8 and about 9; and
deionized water.

The substrate was contacted with the first polishing article at a first contact pressure of about 0.3 psi, a first platen rotational rate of about 20 rpm, a first carrier head rotational rate of about 39 rpm and a first bias of about 2.9 volts was applied during the process. The substrate was polished and examined. The tungsten layer thickness was reduced to about 1,000 Å.

The substrate was transferred to over a second platen having a second polishing article disposed thereon. A second polishing composition was supplied to the platen at a rate of about 300 mL/min, and the second polishing composition comprising:
- about 2 vol % of sulfuric acid;
- about 2 vol % of phosphoric acid;
- about 0.5 wt % of ammonium citrate;
- potassium hydroxide to provide a pH between about 6.4 and about 6.8; and
- deionized water.

The substrate was contacted with the second polishing article at a second contact pressure of about 0.3 psi, a second platen rotational rate of about 14 rpm, a second carrier head rotational rate of about 29 rpm and a second bias of about 2.4 volts was applied during the process. The substrate was polished and examined. The excess tungsten layer formerly on the substrate surface was removed to leave behind the barrier layer and the tungsten trench.

The substrate was then transferred to a third platen and a third second polishing composition was supplied to the platen at a rate of about 250 ml/min, and the second polishing composition comprising:
- about 3 wt. % of hydrogen peroxide;
- about 1 wt. % of ammonium citrate;
- about 0.1 wt. % of polyacrylic acid;
- about 4 wt % of alumina particles;
- a pH between about 4 and about 5; and
- a solvent, and The substrate was contacted with the second polishing article at a second contact pressure of about 2 psi, a second platen rotational rate of about 80 rpm, a second carrier head rotational rate of about 80 rpm. The substrate was polished and examined. The titanium barrier layer formerly on the substrate surface was removed with minimal observable dishing and erosion.

Example 5

A tungsten plated substrate with 300 mm diameter was polished and planarized using the following polishing composition within a modified cell on a REFLEXION® system, available from Applied Materials, Inc., of Santa Clara, Calif. A substrate having a tungsten layer of about 4,000 Å thick on the substrate surface was placed onto a carrier head in an apparatus having a first platen with a first polishing article disposed thereon. A first polishing composition was supplied to the platen at a rate of about 250 mL/min, and the first polishing composition comprising:
- about 2 vol % of sulfuric acid;
- about 2 vol % of phosphoric acid;
- about 2 wt % of ammonium citrate;
- about 2 wt % of ethylenediamine;
- potassium hydroxide to provide a pH between about 8.4 and about 8.9; and
- deionized water.

The substrate was contacted with the first polishing article at a first contact pressure of about 0.3 psi, a first platen rotational rate of about 20 rpm, a first carrier head rotational rate of about 39 rpm and a first bias of about 2.9 volts was applied during the process. The substrate was polished and examined. The tungsten layer thickness was reduced to about 1,000 Å.

The substrate was transferred to over a second platen having a second polishing article disposed thereon. A second polishing composition was supplied to the platen at a rate of about 300 mL/min, and the second polishing composition comprising:
- about 1 vol % of sulfuric acid;
- about 1.5 vol % of phosphoric acid;
- about 0.5 wt % of ammonium citrate;
- potassium hydroxide to provide a pH between about 6.4 and about 6.8; and
- deionized water.

The substrate was contacted with the second polishing article at a second contact pressure of about 0.3 psi, a second platen rotational rate of about 14 rpm, a second carrier head rotational rate of about 29 rpm and a second bias of about 2.4 volts was applied during the process. The substrate was polished and examined. The excess tungsten layer formerly on the substrate surface was removed to leave behind the barrier layer and the tungsten trench.

The substrate was then transferred to a third platen and a third second polishing composition was supplied to the platen at a rate of about 250 ml/min, and the second polishing composition comprising:
- about 3 wt. % of hydrogen peroxide;
- about 1 wt. % of ammonium citrate;
- about 0.1 wt. % of polyacrylic acid;
- about 4 wt % of alumina particles;
- a pH between about 4 and about 5; and
- a solvent, and The substrate was contacted with the second polishing article at a second contact pressure of about 2 psi, a second platen rotational rate of about 80 rpm, a second carrier head rotational rate of about 80 rpm. The substrate was polished and examined. The titanium barrier layer formerly on the substrate surface was removed with minimal observable dishing and erosion.

While the foregoing is directed to embodiments of the present invention, other and further embodiments of the invention may be devised without departing from the basic scope thereof, and the scope thereof is determined by the claims that follow.

What is claimed is:

1. A method of processing a substrate, comprising:
disposing a substrate having patterned feature definitions, a barrier material disposed in the patterned feature definitions, and a tungsten layer formed thereon in a polishing apparatus;
polishing the tungsten layer to expose the barrier layer;
polishing the barrier layer by a process comprising:
providing a barrier polishing composition comprising:
between about 1 wt. % and about 10 wt. % of an oxidizer;
between about 0.5 wt. % and about 5 wt. % of a chelating agent; between about 0.0001 wt % and about 1 wt % of a polymeric stabilizer;
between about 0.3 wt % and about 10 wt % of abrasive particles;
a pH between about 1 and about 6; and
a solvent; and
contacting the substrate to a polishing article;
providing relative motion between the substrate and the polishing article; and
removing the barrier material from the substrate, wherein the barrier layer is removed at a barrier layer removal rate to tungsten removal rate between about 30:1 and about 80:1.

2. The method of claim 1, wherein the composition comprises:
the oxidizer comprises a peroxide compound
the chelating agent comprises a compound having one or more functional groups selected from the group consisting of carboxylic acid groups, amine groups, amide groups, and combinations thereof;
the polymeric stabilizer comprises a polyethylene derivative, a polyacrylic derivative, or a combination thereof;
the abrasive particles are selected from the group of alumina, silica, ceria, and combinations thereof; and
the solvent comprises water.

3. The method of claim 2, wherein the composition comprises:
between about 1 wt. % and about 5 wt. % of hydrogen peroxide;
between about 0.5 wt. % and about 2 wt. % of a salt having one or more functional groups selected from the group consisting of carboxylic acid groups, amine groups, amide groups, and combinations thereof;
between about 0.01 wt % and about 1 wt % of a polyacrylic acid;
between about 0.3 wt % and about 5 wt % of alumina particles;
a pH between about 3 and about 6; and
water.

4. The method of claim 3, wherein the composition comprises:
about 3 wt. % of hydrogen peroxide;
about 1 wt. % of ammonium citrate;
about 0.1 wt. % of polyacrylic acid;
about 4 wt % of alumina particles;
a pH between about 4 and about 5; and
a solvent.

5. A method of processing a substrate comprising:
disposing a substrate having patterned feature definitions, a barrier material disposed in the patterned feature definitions, and a tungsten layer formed thereon in a polishing apparatus having at least one electrochemical mechanical polishing station;
polishing the tungsten layer to expose the barrier layer, wherein polishing the tungsten layer comprises;
polishing the substrate in the at least one electrochemical mechanical polishing station to remove a first portion of the tungsten layer by a process comprising:
providing a first polishing composition between the first electrode and the substrate;
contacting the substrate to a polishing article at a first pressure between the substrate and the polishing article;
providing a first relative motion between the substrate and the polishing article; and
applying a first bias between the first electrode and the second electrode; and
polishing the substrate in the at least one electrochemical mechanical polishing station to remove a second portion of the tungsten layer by a process comprising:
providing a second polishing composition between the first electrode and the substrate;
contacting the substrate to a polishing article at a second pressure between the substrate and the polishing article;
providing a second relative motion between the substrate and the polishing article; and
applying a second bias between the first electrode and the second electrode;
polishing the barrier layer by a process comprising:
providing a barrier polishing composition comprising:
between about 1 wt. % and about 10 wt. % of an oxidizer;
between about 0.5 wt. % and about 5 wt. % of a chelating agent;
between about 0.0001 wt % and about 1 wt % of a polymeric stabilizer;
between about 0.3 wt % and about 10 wt % of abrasive particles;
a pH between about 1 and about 6; and
a solvent; and
contacting the substrate to a polishing article;
providing relative motion between the substrate and the polishing article; and
removing the barrier material from the substrate.

6. The method of claim 5, wherein the barrier layer is removed at a barrier layer removal rate to tungsten removal rate between about 30:1 and about 80:1.

7. A method of processing a substrate comprising a dielectric surface, feature definitions formed in the dielectric surface, a barrier material disposed in the feature definitions and on the dielectric surface, and a conductive material disposed on the barrier material, the method comprising:
polishing the conductive material to expose the barrier material;
disposing the substrate in a process apparatus comprising a first electrode and a second electrode, wherein the substrate is in electrical contact with the second electrode;
providing a polishing composition between the first electrode and the substrate, wherein the polishing composition comprises:
an acid based electrolyte system;
one or more etching agents;
one or more etching inhibitors, wherein the one or more etching inhibitors are selected from the group consisting of polymethylacrylic acids, polycarboxylic acid, polyphosphate, and combinations thereof;
one or more activating agents;
one or more pH adjusting agents to provide a pH between about 2 and about 7; and
a solvent;
applying a pressure between the substrate and a polishing article by use of a polishing head;
providing relative motion between the substrate and the polishing article by mechanical means;
applying a bias between the first electrode and the second electrode; and
removing barrier material from the dielectric surface.

8. The method of claim 7, wherein the bias is applied to the substrate to initiate an anodic dissolution at a current density between about 0.01 milliamps/cm$^2$ and about 20 milliamps/cm$^2$.

9. The method of claim 7, wherein the pressure applied between the substrate and polishing article is between about 0.01 and less than about 2 psi.

10. The method of claim 7, wherein the one or more etching agents include a compound having one or more functional groups selected from the group consisting of amine groups, amide groups, carboxylate groups, dicarboxylate groups, tricarboxylate groups, and combinations thereof.

11. A method of processing a substrate comprising a dielectric surface, feature definitions formed in the dielectric surface, a barrier material disposed in the feature definitions and the dielectric surface, and a conductive material disposed on the barrier material, the method comprising:

polishing the conductive material to expose the barrier material;

disposing the substrate in a process apparatus comprising a first electrode and a second electrode, wherein the substrate is in electrical contact with the second electrode;

providing a polishing composition between the first electrode and the substrate, wherein the polishing composition comprises;

an acid based electrolyte system;

one or more etching agents;

one or more etching inhibitors;

one or more activating agents, wherein the activating agents are selected from the group of iron compounds, aluminum compounds, hexafluorotitanium ($[TiF_6]^{2-}$) salts, hexafluorosilicon ($[SiF_6]^{2-}$), and combinations thereof;

one or more pH adjusting agents to provide a pH between about 2 and about 7; and a solvent;

applying a pressure between the substrate and a polishing article by use of a polishing head;

providing relative motion between the substrate and the polishing article by mechanical means;

applying a bias between the first electrode and the second electrode; and removing barrier material from the dielectric surface.

12. The method of claim 7, wherein the conductive material is tungsten, and the barrier material is selected from the group consisting of titanium, titanium nitride, tantalum, tantalum nitride, and ruthenium.

13. The method of claim 7, wherein the substrate in electrical contact with the second electrode comprises contacting the substrate with a conductive polishing article and the conductive polishing article is electrically connected with the second electrode.

14. The method of claim 13, wherein the polishing article is a conductive polishing material.

* * * * *